US 8,399,780 B2

(12) United States Patent
Cochrane

(10) Patent No.: US 8,399,780 B2
(45) Date of Patent: Mar. 19, 2013

(54) EMI-SHIELDING SOLUTIONS FOR COMPUTER ENCLOSURES USING COMBINATIONS OF TWO AND THREE-DIMENSIONAL SHAPES FORMED IN SHEET METAL

(75) Inventor: Paul Douglas Cochrane, Ottawa (CA)

(73) Assignee: Stealthdrive, Inc., Alexandria, VA (US)

( * ) Notice: Subject to any disclaimer, the term of this patent is extended or adjusted under 35 U.S.C. 154(b) by 0 days.

(21) Appl. No.: 13/276,151

(22) Filed: Oct. 18, 2011

(65) Prior Publication Data
US 2012/0193137 A1 Aug. 2, 2012

Related U.S. Application Data

(63) Continuation-in-part of application No. 11/080,385, filed on Mar. 15, 2005, now Pat. No. 7,511,230.

(51) Int. Cl.
*H01R 4/06* (2006.01)
*H05K 9/00* (2006.01)

(52) U.S. Cl. ......................................... 174/372; 174/384
(58) Field of Classification Search ................ 174/363, 174/372, 367, 384; 361/816
See application file for complete search history.

(56) References Cited

U.S. PATENT DOCUMENTS

| | | | | | |
|---|---|---|---|---|---|
| 4,068,087 | A | * | 1/1978 | Ristig | 174/367 |
| 4,709,121 | A | * | 11/1987 | Shores | 174/375 |
| 5,162,610 | A | * | 11/1992 | Clifton et al. | 174/372 |
| 5,170,009 | A | * | 12/1992 | Kadokura | 174/363 |
| 5,278,351 | A | * | 1/1994 | Herrick | 174/372 |
| 5,473,111 | A | * | 12/1995 | Hattori et al. | 174/363 |
| 5,796,033 | A | * | 8/1998 | Stoyko | 174/363 |
| 5,981,871 | A | * | 11/1999 | Trumble et al. | 174/388 |
| 6,377,472 | B1 | * | 4/2002 | Fan | 361/800 |
| 7,985,931 | B2 | * | 7/2011 | Akama et al. | 174/363 |

* cited by examiner

*Primary Examiner* — Hung Ngo
(74) *Attorney, Agent, or Firm* — Stealthdrive, Inc.; David B. Dort

(57) ABSTRACT

The present invention provides a configuration of a computer-chassis containment or other electromagnetic device method for manufacture in which a "one-hit" solution may be implemented to provide adequate electromagnetic interference shielding (EMC shielding) and is configured such that shielding gaskets, "spoons" or other excessive structures may be reduced or eliminated completely. Patterned sinusoidal "patterns" that are stamped, molded, cut, or extruded into one or more sides of a "box" provide sufficient EMI shielding, such that the need for gaskets is reduced or eliminated.

6 Claims, 28 Drawing Sheets

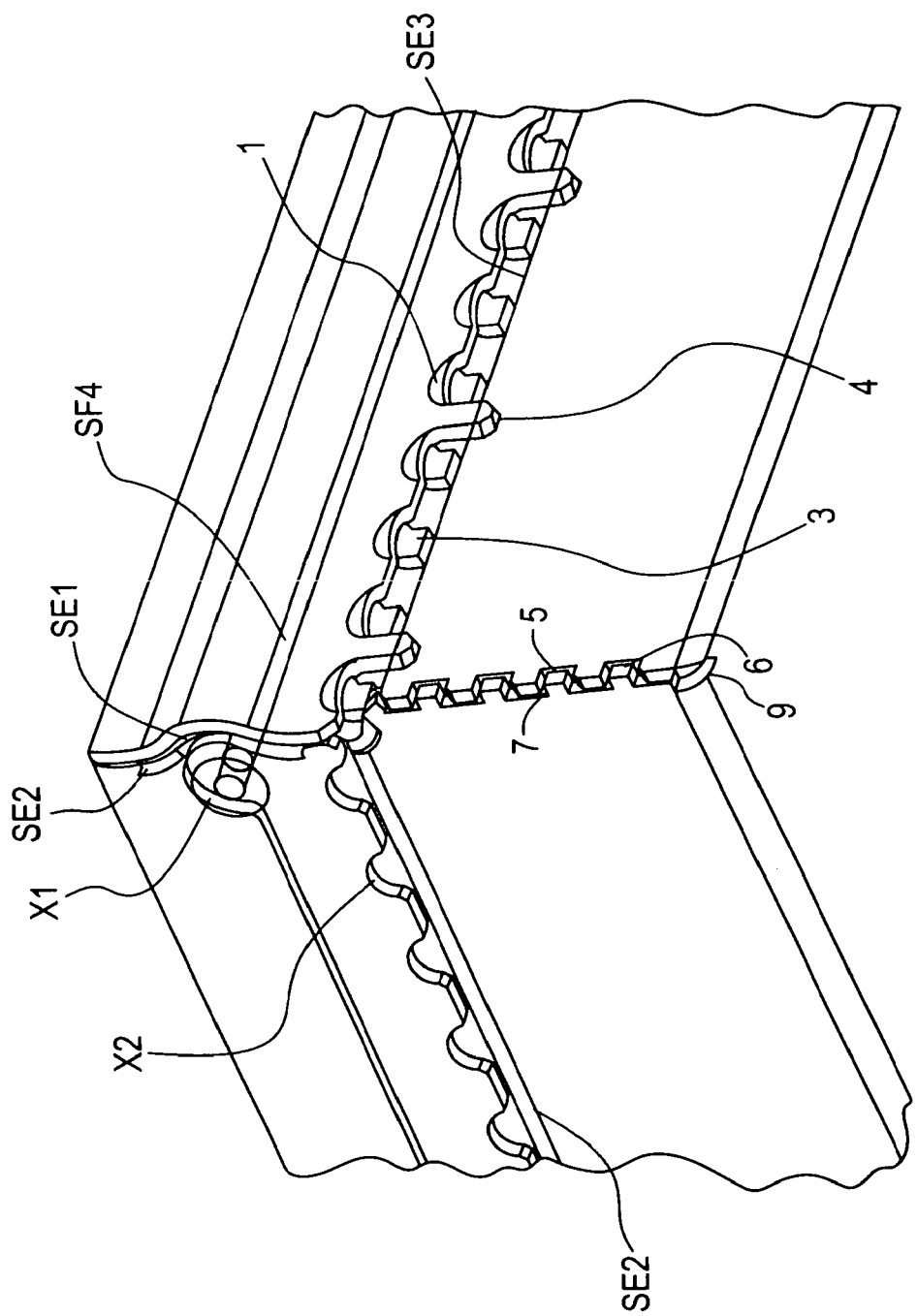

EMI-SHIELDING SOLUTIONS FOR COMPUTER ENCLOSURES USING COMBINATIONS OF TWO AND THREE-DIMENSIONAL SHAPES FORMED IN SHEET METAL

REFERENCE TO PRIORITY DOCUMENTS

The present application claims priority under 35 USC §120 to, and is a continuation-in-part of, co-pending U.S. application Ser. No. 11/080,385, filed Mar. 15, 2005 and entitled Reduced cost and gasketting "one-hit" and other manufacturing EMI-shielding solutions for computer enclosures, which is incorporated by reference for all purposes.

This application claims priority under 35 USC §119(e) to U.S. Provisional Patent Application Ser. No. 60/891,720 entitled Hybrid 2-D and 3-D Attenuation Shapes for Electronics Enclosures filed Feb. 27, 2007.

BACKGROUND

The following background section is, in part, reprinted from "*Design Techniques for EMC—Part 4 Shielding*" by Eur Ing Keith Armstrong, Cherry Clough Consultants, Asociate of EMC-UK.

A complete volumetric shield is often known as a "Faraday Cage", although this can give the impression that a cage full of holes (like Mr Faraday's original) is acceptable, which it generally is not. There is a cost hierarchy to shielding which makes it commercially important to consider shielding early in the design process. Shields may be fitted around the following: individual ICs—example cost 25P; segregated areas of PCB circuitry—example cost £1; whole PCBs—example cost £10; sub-assemblies and modules—example cost £15; complete products—example cost £100; assemblies (e.g. industrial control and instrumentation cubicles)—example cost £1,000; rooms—example cost £10,0000; and buildings—example cost £100,000.

Shielding always adds cost and weight, so it is always best to use the other techniques described in this series to improve EMC and reduce the need for shielding. Even when it is hoped to avoid shielding altogether, it is best to allow for Murphy's Law and design from the very conception so that shielding can be added later if necessary. A degree of shielding can also be achieved by keeping all conductors and components very close to a solid metal sheet. Ground-planed PCBs populated entirely by low-profile surface mounted devices are therefore are recommended for their EMC advantages.

A useful degree of shielding can be achieved in electronic assemblies firstly, by keeping their internal electronic units and cables very close to an earthed metal surface at all times, and secondly, by bonding their earths directly to the metal surface instead of (or as well as) using a safety star earthing system based on green/yellow wires. This technique usually uses zinc-plated mounting plates or chassis, and can help avoid the need for high values of enclosure SE.

Many textbooks have been written on the subject of how shields work, and it is not intended to repeat them here. However, a few broad concepts will help. A shield puts an impedance discontinuity in the path of a propagating radiated electromagnetic wave, reflecting it and/or absorbing it. This is conceptually very similar to the way in which filters work—they put an impedance discontinuity in the path of an unwanted conducted signal. The greater the impedance ratio, the greater the SE.

At thicknesses of 0.5 mm or over, most normal fabrication metals provide good SE above 1 MHz and excellent SE above 100 MHz. Problems with metal shields are mostly caused by thin materials, frequencies below 1 MHz, and apertures.

It is generally best to allow a large distance between the circuits that are shielded and the walls of their shield. The emitted fields outside of the shield, and the fields that the devices are subjected to, will generally be more "diluted" the larger the shielded volume.

When enclosures have parallel walls opposite each other, standing waves can build up at resonant frequencies and these can cause SE problems. Irregular shaped enclosures or ones with curved or non-parallel walls will help prevent resonances. When opposing shield walls are parallel, it is desirable to prevent resonances from occurring at the same frequencies due to width, height, or length. So, in order to avoid cubic enclosures, rectangular cross-sections can be used instead of square ones, and it is preferable to avoid dimensions that are simple multiples of each other. For example, if the length is 1.5 times the width, the second resonance of the width should coincide with the third resonance of the length. It is preferable to use irrationally ratio'd dimensions, such as those provided by the Fibonacci series.

Fields come in two flavours: electric (E) and magnetic (M). Electromagnetic fields consist of E and M fields in a given ratio (giving a wave impedance E/M of 377 in air). Electric fields are easily stopped by thin metal foils since the mechanism for electric field shielding is one of charge re-distribution at a conductive boundary; therefore, almost anything with a high conductivity (low resistance) will present suitably low impedance. At high frequencies, considerable displacement currents can result from the rapid rate of charge re-distribution, but even thin aluminium can manage this well. However, magnetic fields are much more difficult to stop. They need to generate eddy currents inside the shield material to create magnetic fields that oppose the impinging field. Thin aluminium is not going to be very suitable for this purpose, and the depth of current penetration required for a given SE depends on the frequency of the field. The SE also depends on the characteristics of the metal used for the shield which is known as the "skin effect".

The skin depth of the shield material known as the "skin effect" makes the currents caused by the impinging magnetic field to be reduced by approximately 9 dB. Hence a material which was as thick as 3 skin depths would have an approximately 27 dB lower current on its opposite side and have an SE of approximately 27 dB for that M field.

The skin effect is especially important at low frequencies where the fields experienced are more likely to be predominantly magnetic with lower wave impedance than 377Ω. The formula for skin depth is given in most textbooks; however, the formula requires knowledge of the shielding material's conductivity and relative permeability.

Copper and aluminium have over 5 times the conductivity of steel, so are very good at stopping electric fields, but have a relative permeability of 1 (the same as air). Typical mild steel has a relative permeability of around 300 at low frequencies, falling to 1 as frequencies increase above 100 kHz. The higher permeability of mild steel gives it a reduced skin depth, making the reasonable thicknesses better than aluminium for shielding low frequencies. Different grades of steels (especially stainless) have different conductivities and permeabilities, and their skin depths will vary considerably as a result. A good material for a shield will have high conductivity and high permeability, and sufficient thickness to achieve the required number of skin-depths at the lowest frequency of concern. 1 mm thick mild steel plated with pure zinc (for instance 10 microns or more) is suitable for many applications.

It is easy to achieve SE results of 100 dB or more at frequencies above 30 MHz with ordinary constructional metalwork. However, this assumes a perfectly enclosing shield volume with no joints or gaps, which makes assembly of the product rather difficult unless you are prepared to seam-weld it completely and also have no external cables, antenna, or sensors (rather an unusual product). In practice, whether shielding is being done to reduce emissions or to improve immunity, most shield performance are limited by the apertures within it. Considering apertures as holes in an otherwise perfect shield implies that the apertures act as half-wave resonant "slot antenna". This allows us to make predictions about maximum aperture sizes for a given SE: for a single aperture, SE=20 log (Ω/2 d) where Ω is the wavelength at the frequency of interest and d is the longest dimension of the aperture. In practice, this assumption may not always be accurate, but it has the virtue of being an easy design tool which is a good framework. It may be possible to refine this formula following practical experiences with the technologies and construction methods used on specific products.

The resonant frequency of a slot antenna is governed by its longest dimension—its diagonal. It makes little difference how wide or narrow an aperture is, or even whether there is a line-of-sight through the aperture.

Even apertures, the thickness of a paint or oxide film, formed by overlapping metal sheets, still radiate (leak) at their resonant frequency just as well as if they were wide enough to poke a finger through. One of the most important EMC issues is keeping the product's internal frequencies internal, so they don't pollute the radio spectrum externally.

The half-wave resonance of slot antenna (expressed in the above rule of thumb: SE=20 log(2 d)) using the relationship $v=f\lambda$ (where v is the speed of light: $3.10^8$ metres/sec, f is the frequency in Hz, and is the wavelength in metres). We find that a narrow 430 mm long gap along the front edge of a 19-inch rack unit's front panel will be half-wave resonant at around 350 MHz. At this frequency, our example 19" front panel is no longer providing much shielding and removing it entirely might not make much difference. For an SE of 20 dB at 1 GHz, an aperture no larger than around 16 mm is needed. For 40 dB this would be only 1.6 mm, requiring the gaskets to seal apertures and/or the use of the waveguide below cut-off techniques described later. An actual SE in practice will depend on internal resonances between the walls of the enclosure itself, the proximity of components and conductors to apertures (keep noisy cables such as ribbon cables carrying digital busses well away from shield apertures and joints) and the impedances of the fixings used to assemble the parts of the enclosure, etc.

Wherever possible, it is desirable to break all necessary or unavoidable apertures into a number of smaller ones. Unavoidably long apertures (covers, doors, etc) may need conductive gaskets or spring fingers (or other means of maintaining shield continuity). The SE of a number of small identical apertures nearby each other is (roughly) proportional to their number (SE=20 logn, where n is the number of apertures), so two apertures will be worse by 6 dB, four by 12 dB, 8 by 18 dB, and so on. But when the wavelength at the frequency of concern starts to become comparable with the overall size of the array of small apertures, or when apertures are not near to each other (compared with the wavelength), this crude 6 dB per doubling rule breaks down because of phase cancellation effects.

Apertures placed more than half a wavelength apart do not generally worsen the SEs that achieves individually, but half a wavelength at 100 MHz is 1.5 metres. At such low frequencies on typical products smaller than this, an increased number of apertures will tend to worsen the enclosure's SE.

Apertures don't merely behave as slot antenna. Currents flowing in a shield and forced to divert their path around an aperture will cause it to emit magnetic fields. Voltage differences across an aperture will cause the aperture to emit electric fields. The author has seen dramatic levels of emissions at 130 MHz from a hole no more than 4 mm in diameter (intended for a click-in plastic mounting pillar) in a small PCB-mounted shield over a microcontroller.

The only really sensible way to discover the SE of any complex enclosure with apertures is to model the structure, along with any PCBs and conductors (especially those that might be near any apertures) with a 3-dimensional field solver. Software packages that can do this now have more user-friendly interfaces and run on desktop PCs. Alternatively, the user will be able to find a university or design consultancy that has the necessary software and the skills to drive it.

Since an SE will vary strongly with the method and quality of assembly, materials, and internal PCBs and cables, it is always best to allow an SE 'safety margin' of 20 dB. It may also be advantageous to at least include design-in features that will allow improvement of the SE by at least 20 dB if there are problems with the final design's verification/qualification testing.

The frequency of 50 Hz is problematic, and an SE at this frequency with any reasonable thickness of ordinary metals is desirable. Special materials such as Mumetal and Radiometal have very high relative permeabilities, often in the region of 10,000. Their skin depth is correspondingly very small, but they are only effective up to a few tens of kHz. It is advantageous to take care not to knock items made of these materials, as this ruins their permeability and they have to be thrown away or else re-annealed in a hydrogen atmosphere. These exotic materials are used rather like channels to divert the magnetic fields away from the volume to be protected. This is a different concept to that used by ordinary shielding.

All metals shield materials with relative permeability greater than 1 can saturate in intense magnetic fields, and then don't work well as shields and often heat up. A steel or Mumetal shield box over a mains transformer to reduce its hum fields can saturate and fail to achieve the desired effect. Often, this is all that is necessary to make the box larger so it does not experience such intense local fields. Another shielding technique for low frequency shielding is active cancellation, and at least two companies have developed this technique specifically for stabilizing the images of CRT VDUs in environments polluted by high levels of power frequency magnetic fields.

FIG. 1D shows that if we extend the distance that a wave leaking through an aperture has to travel between surrounding metal walls before it reaches freedom, we can achieve respectable SEs even though the apertures may be large enough to put a first through. This very powerful technique is called "waveguide below cut-off". Honeycomb metal constructions are really a number of waveguides below cut-off stacked side-by-side, and are often used as ventilation grilles for shielded rooms, similar to high-SE enclosures. Like any aperture, a waveguide allows all its impinging fields to pass through when its internal diagonal (g) is half a wavelength. Therefore, the cut-off frequency of our waveguide is given by: $f_{cutoff}$=150,000/g (answer in MHz when g is in mm.) Below its cut-off frequency, a waveguide does not leak like an ordinary aperture (as shown by FIG. 1A) and can provide a great deal of shielding: for $f<0.5\ f_{cutoff}$ SE is approximately 27 d/g where d is the distance through the waveguide the wave has to travel before it is free.

FIG. 1A shows examples of the SE achieved by six different sizes of waveguides below cut-off. Smaller diameter (g) results in a higher cut-off frequency, with a 50 mm (2 inch) diameter achieving full attenuation by 1 GHz. Increased depth (d) results in increased SE, with very high values being readily achieved.

Waveguides below cut-off do not have to be made out of tubes, and can be realized using simple sheet metalwork which folds the depth (d) so as not to increase the size of the product by much. As a technique, it is only limited by the imagination, but it must be taken into consideration early in a project as it is usually difficult to retro-fit to a failing product not intended for use. Conductors should never be passed through waveguides below cut-off, as this compromises their effectiveness. Waveguides below cut-off can be usefully applied to plastic shafts (e.g. control knobs) so that they do not compromise the SE where they exit an enclosure. The alternative is to use metal shafts with a circular conductive gasket and suffer the resulting friction and wear. Waveguides below cut-off can avoid the need for continuous strips of gasket, and/or for multiple fixings, and thus save material costs and assembly times.

Gaskets are used to prevent leaky apertures at joints, seams, doors and removable panels. For fit-and-forget assemblies, gasket design is not too difficult, but doors, hatches, covers, and other removable panels create many problems for gaskets, as they must meet a number of conflicting mechanical and electrical requirements, not to mention chemical requirements (to prevent corrosion). Shielding gaskets are sometimes required to be environmental seals as well, adding to the compromise.

FIG. 1B shows a typical gasket design for the door of an industrial cabinet, using a conductive rubber or silicone compound to provide an environmental seal as well as an EMC shield. Spring fingers are often used in such applications as well.

It is worth noting that the green/yellow wire used for safety earthing of a door or panel has no benefits for EMC above a few hundred kHz. This might be extended to a few MHz if a short wide earthing strap is used instead of a long wire.

A huge range of gasket types is available from a number of manufacturers, most of whom also offer customizing services. This observation reveals that no one gasket is suitable for a wide range of applications. Considerations when designing or selecting gaskets include: (1) mechanical compliance; (2) compression set; (3) impedance over a wide range of frequencies; (4) resistance to corrosion (low galvanic EMFs in relation to its mating materials, appropriate for the intended environment); (5) the ability to withstand the expected rigors of normal use; (6) shape and preparation of mounting surface (7) ease of assembly and dis-assembly; and (8) environmental sealing, and smoke and fire requirements.

There are four main types of shielding gaskets: conductive polymers, conductively wrapped polymers, metal meshes and spring fingers. (1) Conductive polymers (insulating polymers with metal particles in them double as environmental seals, and have low compression set but need significant contact pressure, making them difficult to use in manually-opened doors without lever assistance. (2) Conductively wrapped polymers (polymer foam or tube with a conductive outer coating can be very soft and flexible, with a low compression set. Some only need low levels of contact pressure. However, they may not make the best environmental seals and their conductive layer may be vulnerable to wear. (3) Metal meshes (random or knitted) are generally very stiff but match the impedance of metal enclosures better and so have better SEs than the above types. They have poor environmental sealing performance, but some are now supplied bonded to an environmental seal, so that two types of gaskets may be applied in one operation. (4) Spring fingers ("finger stock") are usually made of beryllium copper or stainless steel and can be very compliant. Their greatest use is on modules (and doors) which must be easy to manually extract (open), easy to insert (close), and which have a high level of use. Their wiping contact action helps to achieve a good bond, and their impedance match to metal enclosures is good, but when they don't apply high pressures, maintenance may be required (possibly a smear of petroleum jelly every few years). Spring fingers are also more vulnerable to accidental damage, such as getting caught in a coat sleeve and bending or snapping off. The dimensions of spring fingers and the gaps between them causes inductance, so for high frequencies or critical use a double row may be required, such as can be seen on the doors of most EMC test chambers.

Gaskets need appropriate mechanical provisions made on the product to be effective and easy to assemble. Gaskets simply stuck on a surface and squashed between mating parts may not work as well as is optimal—the more their assembly screws are tightened in an effort to compress the gasket and make a good seal, the more the gaps between the fixings can bow, opening up leaky gaps. This is because of inadequate stiffness in the mating parts, and it is difficult to make the mating parts rigid enough without a groove for the gasket to be squashed into, as shown by FIG. 1B. This groove also helps correctly position and retains the gasket during assembly.

Gasket contact areas must not be painted (unless it is with conductive paint), and the materials used, their preparation and plating must be carefully considered from the point of view of galvanic corrosion. All gasket details and measures must be shown on manufacturing drawings, and all proposed changes to them must be assessed for their impact on shielding and EMC. It is not uncommon, when painting work is transferred to a different supplier, for gaskets to be made useless because masking information was not put on the drawings. Changes in the painting processes used can also have a deleterious effect (as can different painting operatives) due to varying degrees of overspray into gasket mounting areas which are not masked off.

FIG. 1C shows a large aperture in the wall of the shielded enclosure, using an internal "dirty box" to control the field leakage through the aperture. The joint between the dirty box and the inside of the enclosure wall must be treated the same as any other joint in the shield.

A variety of shielded windows are available, based on two main technologies: thin metal films on plastic sheets and embedded metal meshes. (1) Thin metal films on plastic sheets, usually indium-tin-oxide (ITO). At film thicknesses of 8 microns and above, optical degradation starts to become unacceptable, and for battery-powered products, the increased backlight power may prove too onerous. The thickness of these films may be insufficient to provide good SEs below 100 MHz. (2) Embedded metal meshes, are usually made of a fine mesh of blackened copper wires. For the same optical degradation as a metal film, these provide much higher SEs, but they can suffer from Moiré fringing with the display pixels if the mesh is not sized correctly. One trick is to orient the mesh diagonally.

Honeycomb metal display screens are also available for the very highest shielding performance. These are large numbers of waveguides below cut-off, stacked side by side, and are mostly used in security or military applications. The extremely narrow viewing angle of the waveguides means that the operator's head prevents anyone else from sneaking a look at their displays.

The mesh size must be small enough not to reduce the enclosure's SE too much. The SE of a number of small identical apertures near to each other is (roughly) proportional to their number, n, (DSE=20 logn), so two apertures will make SE worse by 6 dB, four by 12 dB, 8 by 18 dB, and so on. For a large number of small apertures typical of a ventilation grille, mesh size will be considerably smaller than one aperture on its own would need to be for the same SE. At higher frequencies where the size of the ventilation aperture exceeds one-quarter of the wavelength, this crude "6 dB per doubling" formula can lead to over-engineering, but no simple rule of thumb exists for this situation.

Waveguides below cut-off allow high air flow rates with high values of SE. Honeycomb metal ventilation shields (consisting of many long narrow hexagonal tubes bonded side-by-side) have been used for this purpose for many years. It is believed that at least one manufacturer of highly shielded 19" rack cabinets claims to use waveguide below cut-off shielding for the top and bottom ventilation apertures that use ordinary sheet metalwork techniques.

The design of shielding for ventilation apertures can be complicated by the need to clean the shield of the dirt deposited on it from the air. Careful air filter design can allow ventilation shields to be welded or otherwise permanently fixed in place.

Plastic enclosures are often used for a pleasing feel and appearance, but can be difficult to shield. Coating the inside of the plastic enclosure with conductive materials such as metal particles in a binder (conductive paint), or with actual metal (plating), is technically demanding and requires attention to detail during the design of the mould tooling if it is to stand a chance of working.

It is often found, when it is discovered that shielding is necessary, that the design of the plastic enclosure does not permit the required SE to be achieved by coating its inner surfaces. The weak points are usually the seams between the plastic parts; they often cannot ensure a leak-tight fit, and usually cannot easily be gasketted. Expensive new mould tools are often needed, with consequent delays to market introduction and to the start of income generation from the new product.

Whenever a plastic case is required for a new product, it is financially vital that consideration be given to achieving the necessary SE right from the start of the design process.

Paint or plating on plastic can never be very thick, so the number of skin-depths achieved can be quite small. Some clever coatings using nickel and other metals have been developed to take advantage of nickel's reasonably high permeability in order to reduce skin depth and achieve better SE.

Other practical problems with painting and plating include making them stick to the plastic substrate over the life of the product in its intended environment. This is not easy to do without expert knowledge of the materials and processes. Conductive paint or plating flaking off inside a product can do a lot more than compromise EMC—it can short out conductors, causing unreliable operation and risk fires and electrocution. Painting and plating plastics must be done by experts with long experience in that specialized field.

A special problem with painting or plating plastics is voltage isolation. For class II products (double insulated), adding a conductive layer inside the plastic cases can reduce creepage and clearance distances and compromise electrical safety. Also, for any plastic-cased product, adding a conductive layer to the internal surface of the case can encourage personnel electrostatic discharge (ESD) through seams and joints, possibly replacing a problem of radiated interference with the problem of susceptibility to ESD. For commercial reasons, it is important that careful design of the plastic enclosure occurs from the beginning of the design process if there is any possibility that shielding might eventually be required.

Some companies box cleverly (pun intended) by using thin and unattractive low-cost metal shields on printed circuit boards or around assemblies, making it unnecessary for their pretty plastic case to do double duty as a shield. This can save a great deal of cost and headache, but must be considered from the start of a project or else there will be no room available (or the wrong type of room) to fit such internal metalwork.

Volume-conductive plastics or resins generally use distributed conductive particles or threads in an insulating binder which provides mechanical strength. Sometimes these suffer from forming a "skin" of the basic plastic or resin, making it difficult to achieve good RF bonds without helicoil inserts or similar means. These insulating skins make it difficult to prevent long apertures which are created at the joints, and also make it difficult to provide good bonds to the bodies of connectors, glands, and filters. Problems with the consistency of mixing conductive particles and polymers can make enclosures weak in some areas and lacking in shielding in others.

Materials based on carbon fibres (which are themselves conductive) and self-conductive polymers are starting to become available, but they do not have the high conductivity of metal and so do not give as good an SE for a given thickness. The screens and connectors (or glands) of all screened cables that penetrate a shielded enclosure, and their 360° bonding, are as vital a part of any "Faraday Cage" as the enclosure metalwork itself. The thoughtful assembly and installation of filters for unshielded external cables is also vital to achieve a good SE. Refer to the draft IEC1000-5-6 (95/210789 DC from BSI) for best practices in industrial cabinet shielding (and filtering). Refer to BS IEC 61000-5-2: 1998 for best practices in cabling (and earthing).

Returning to our original theme of applying shielding at as low a level of assembly as possible to save costs, we should consider the issues of shielding at the level of the PCB. The ideal PCB-level shield is a totally enclosing metal box with shielded connectors and feedthrough filters mounted in its walls, which is in fact just a miniature version of a product-level shielded enclosure as described above. The result is often called a module which can provide extremely high SEs, and is very often used in the RF and microwave worlds.

Lower cost PCB shields are possible, although their SE is not usually as good as a well-designed module. It all depends upon a ground plane in a PCB used to provide one side of the shield, so that a simple five-sided box can be assembled on the PCB like any other component. Soldering this five-sided box to the ground plane at a number of points around its circumference creates a "Faraday cage" around the desired area of circuitry. A variety of standard five-sided PCB-mounted shielding boxes are readily available, and companies who specialize in this kind of precision metalwork often make custom designs. Boxes are available with snap-on lids so that adjustments may easily be made, test points accessed, or chips replaced, with the lid off. Such removable lids are usually fitted with spring-fingers all around their circumference to achieve a good SE when they are snapped in place.

Weak points in this method of shielding are obviously the different variations of apertures such as the following: the apertures created by the gaps between the ground-plane soldered connections; any apertures in the ground plane (for example clearances around through-leads and via holes); and any other apertures in the five-sided box (for example ventilation, access to adjustable components, displays, etc.) Seam-soldering the edges of a five-sided box to a component-side ground plane can remove one set of apertures, at the cost of a time-consuming manual operation.

For the lowest cost, we want to bring all our signals and power into the shielded area of our PCB as tracks, avoiding wires and cables. This means we need to use the PCB equivalents of bulkhead-mounting shielded connectors and bulkhead-mounting filters.

The PCB track equivalent of a shielded cable is a track run between two ground planes, often called a "stripline." Sometimes guard tracks are run on both sides of this "shielded track" on the same copper layer. These guard tracks have very frequently via holes bonding them to the top and bottom ground planes. The number of via holes per inch is the limiting factor here, as the gaps between them act as shield apertures (the guard tracks have too much inductance on their own to provide a good SE at high-frequencies). Since the dielectric constant of the PCB material is roughly four times that of air, when FIGS. 1A-1E are used to determine via spacing, their frequency axes should be divided by two (the square root of the PCB's dielectric constant). Some designers don't bother with the guard tracks and just use via holes to "channel" the track in question. It may be a good idea to randomly vary the spacings of such rows of via holes around the desired spacing in order to help avoid resonances.

Where striplines enter an area of circuitry enclosed by a shielded box, it is sufficient that their upper and lower ground planes (and any guard tracks) are bonded to the screening can's soldered joints on both sides close to the stripline.

The track which only has a single ground plane layer parallel, the other side being exposed to the air, is said to be of "microstrip" construction. When a microstrip enters a shielded PCB box, it will suffer an impedance discontinuity due to the wall of the box. If the wavelength of the highest frequency component of the signals in the microstrip is greater than 100 times the thickness of the box wall (or the width of box mounting flange), the discontinuity may be too brief to register. But where this is not the case, some degradation in performance may occur and such signals are best routed using striplines.

All unshielded tracks must be filtered as they enter a shielded PCB area. It is often possible to get valuable improvements using PCB shielding without such filtering, but this is difficult to predict. Therefore, filtering should always be designed-in (at least on prototypes, only being removed from the PCB layout after successful EMC testing).

The best filters are feedthrough types, but to save cost it is advantageous to avoid wired types. Leaded PCB-mounting types are available and can be soldered to a PCB in the usual manner. Then the leaded PCB mount is hand-soldered to the wall of the screening box when it is fitted at a later stage. Quicker assembly can be achieved by soldering the central contact of the filter to the underlying ground plane, making sure that solder joints between the shielding box and the same ground plane layer are close by on both sides. This latter construction also suits surface-mounted "feed-through" filters, further reducing assembly costs.

But feed-through filters, even surface mounted types, are still more expensive than simple ferrite beads or capacitors. To allow the most cost-effective filters to be found during development EMC testing, whilst also minimizing delay and avoiding PCB layout iterations, multipurpose pad patterns can easily be created to take any of the following filter configurations: (1) zero-ohm link (no filtering, often used as the starting point when EMC testing a new design); (2) a resistor or ferrite bead in series with the signal; ((3) a capacitor to the ground plane; (4) common-mode chokes; (5) resistor/ferrite/capacitor combinations (tee, LC, etc. see Part 3 of this series for more details); (6) feed-through capacitor (i.e. centre-pin grounded, not truly feed-through) and; (7) feedthrough filter (tee, LC, etc., center-pin grounded, not truly feedthrough). Multipurpose padding also means the invention not restricted to proprietary filters and be created to best suit the requirements of the circuit (and the product as a whole) at the lowest cost.

In finding EMI/EMC solutions, the existing technology is inelegant and cumbersome. For example, the prior art uses spoons, which are these little projections with dimples in them that stick out; so that they go into compression and go opposite. One goes over the other so that they go together and they have to make physical contact. These structures bend and when one of them bends at a plane and they don't make contact anymore, they lose their electrical conduct. Then the prior art starts to have EMI leaks. They become tolerance nightmares and they're expensive. In addition, prior art manufacturing techniques designed to counter these problems requires forming the enclosure so that it has to have a tongue and groove or other prohibitive solutions.

SUMMARY OF THE INVENTION

The present invention removes the need for the single most expensive and least reliable aspect of the electro-mechanical packaging, which is the EMI gasket. The solution(s) provided by the present invention will eliminate the need for gaskets in a great number of applications, as well as "spoons" and other similarly troublesome structures in the PC Chassis and other electronics enclosures. The present invention provides a configuration of placing two and three dimensional shapes into and across the seams of a four-by-two or four-by-one-by-one six sided enclosure, in which the 2D and 3D shapes, which are easily formed in conductive metal (or conductive polymers) allow for improved EMI shielding, but also decrease assembly and manufacturing costs (especially in preferred embodiments). EMI will have a difficult time escaping (or entering) the enclosure because it cannot "see around" the continuous 2D shapes and get trapped and reflected in the 3D attenuating shapes. Particular embodiments use exclusively two or three dimensional shapes, but in a preferred embodiment the 2D and 3D attenuating shapes are combined along the seams as they are needed in both regular and irregular patterns.

BRIEF DESCRIPTION OF THE DRAWINGS

FIG. 11B illustrates details of the third ("four box") alternate embodiment;

DETAILED DESCRIPTION

Figure 1A:
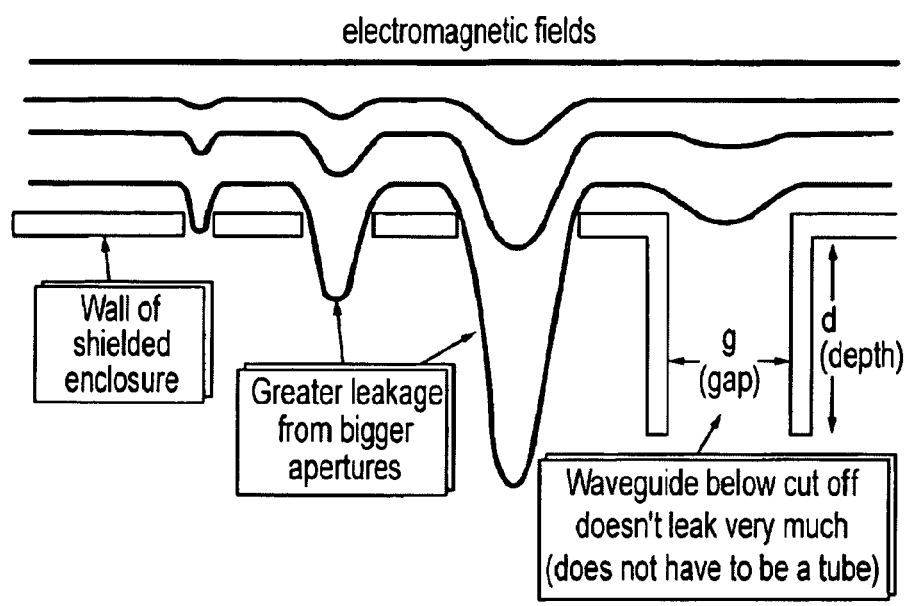
FIGS. 1A-1E illustrate various electromagnetic interference shielding principles.
Figure 1B:
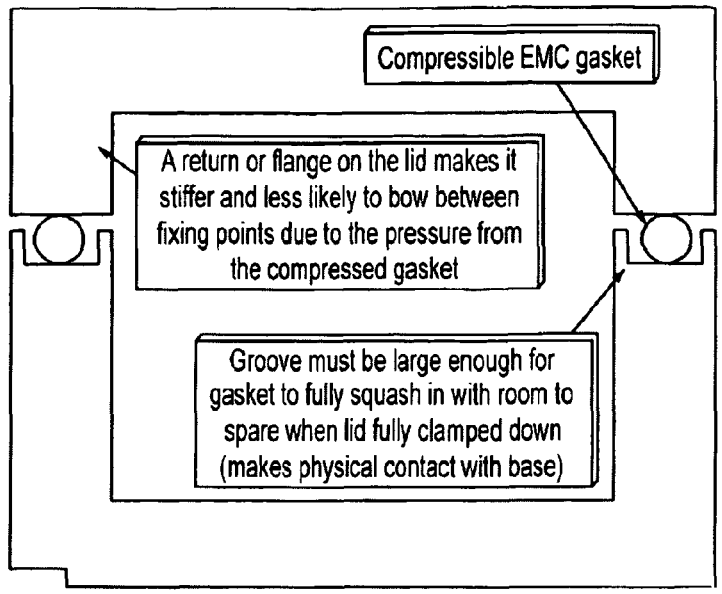
Figure 1C:
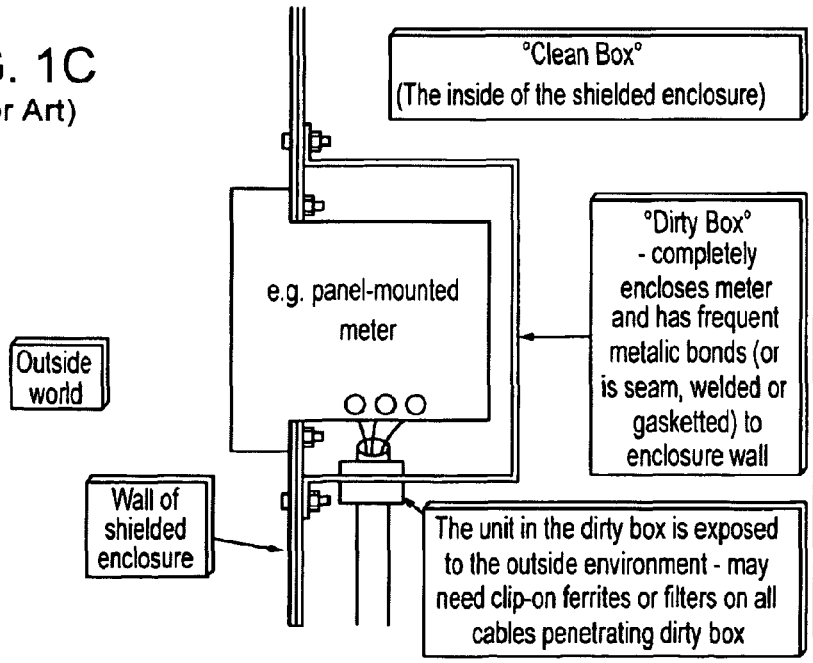
Figure 1D:
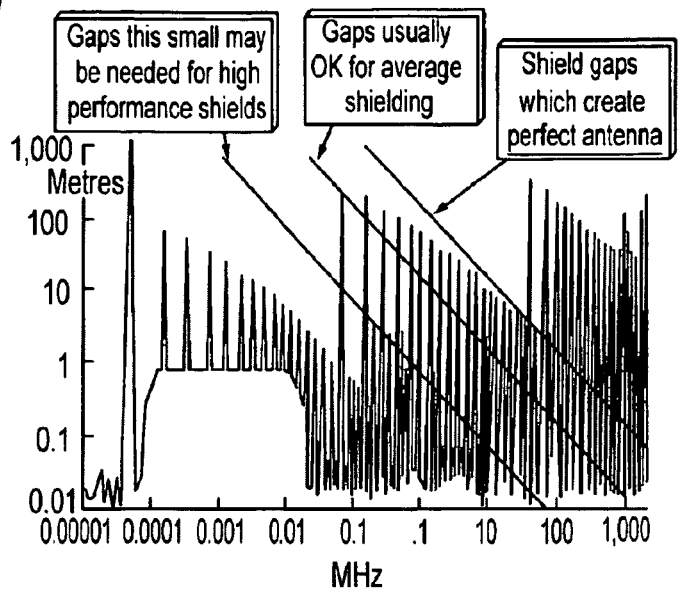

The half-wave resonance of slot antenna, expressed in the above rule of thumb, is the basis for the solid line in FIG. 1D (and for the rule-of-thumb of FIG. 1E) using the relationship: SE=20 log ($\lambda$/2d). Therefore the degradation associated with a multiple hole pattern is given by: SE reduction=10 log (N), where N=the # of holes in the pattern. Using the relationship: fo$\lambda$=c, where is c the speed of light: $3 \times 10^8$ m/sec, the frequency in Hz, and $\lambda$ is the wavelength in meters, where: f=the frequency of the wave $\lambda$=the wavelength, c=the speed of light.

Shielding is the use of conductive materials to reduce EMI by reflection or absorption. Shielding electronic products successfully from EMI is a complex problem with three essential ingredients: a source of interference, a receptor of interference, and a path connecting the source to the receptor. If any of these three ingredients is missing, there is no interference problem. Interference takes many forms such as distortion on a television, disrupted/lost data on a computer, or "crackling" on a radio broadcast. The same equipment may be a source of interference in one situation and a receptor in another.

Currently, the FCC regulates EMI emissions between 30 MHz and 2 GHz, but does not specify immunity to external interference. As device frequencies increase (applications over 10 GHz are becoming common), their wavelengths decrease proportionally, meaning that EMI can escape/enter very small openings (for example, at a frequency of 1 GHz, an opening must be less than ½ inch). The trend toward higher frequencies therefore is helping drive the need for more EMI shielding. As a reference point, computer processors operate in excess of 250 MHz and some newer portable phones operate at 900 MHz.

Metals (inherently conductive) traditionally have been the material of choice for EMI shielding. In recent years, there has been a tremendous surge in plastic resins (with conductive coatings or fibers) replacing metals due to the many benefits of plastics. Even though plastics are inherently transparent to electromagnetic radiation, advances in coatings and fibers have allowed design engineers to consider the merits of plastics.

As a specific example, considering the FCC regulation to shield up to 2 GHz, a typical maximum clock speed in many of the controllers in the enterprise networks would be 400 MHz. If you consider the 2 GHz value as the maximum frequency of interest, then at 400 MHz, the user will shield up to and including the 5th harmonic of a 400 MHz signal . . . i.e. 400 MHz*5=2 GHz (shielding to the 5th harmonic of maximum clock speed of 400 MHz).

To determine the wavelength at 2 GHz, utilize equation C, above: f o $\lambda$=c, $\lambda$=c/f $\lambda$=$(3 \times 10^8)/(2*10^9)$ $\lambda$=0.15 meters (at 2 GHz). Terms A & B are of interest regarding the determination of a longest possible slot length $\lambda$/2=0.075 m or 75 mm. It is recommended that the apertures be kept to a range of approximately $\lambda$/20 to $\lambda$/50, therefore for 2 GHz, the apertures should be in the range of: $\lambda$/20=0.0075 meters or 7.5 mm maximum @ 2 GHz; $\lambda$/50=0.003 meters or 3.0 mm minimum @ 2 GHz.

Looking to equation from above, the shielding effectiveness for 1 hole of maximum length "X": SE=20 log ($\lambda$/2 d) (there is no minimum—the smaller the better—this equation is used as a practical value for packaging.) @ 3 mm→SE=20 log (0.15/(2o0.003))=20 log (25)=28 dB' @ 7.5 mm→SE=20 log (0.15/(2o0.0075))=20 log (10)=20 dB.

Therefore, in a standard application there are multiple holes—for example, a perfed 0.060" thick steel faceplate SE reduction=10 log (N) has a hole pattern comprised of 100 holes and an SE reduction=10 log (N)=10 log (100)=20 (please see FIG. 8 for a diagram). The result is the reduction of the shielding to zero in the case of the 7.5 mm holes and the reduction of the shielding to 8 dB in the case of the 3 mm holes.

This is where the restrictive nature of EMI emerges and the interplay between getting cooling air in without letting magnetic interference out becomes more significant. One of the principles upon which the invention takes advantage of is illustrated by FIG. 1A.

It is recommended that most packaging applications provide ~15 dB of shielding at the enclosure level. As is evident from the above information, this is far from easy to accomplish without an advance in the technology. It should be noted that the degradation described above does not even consider all the losses at seams where the gaskets are actually used. This is only the pert for airflow.

DETAILED DESCRIPTION OF THE DRAWINGS

In the primary embodiment of The TORTURED PATH™ EMI solution is shown for enclosures that are generally in the shape of boxes and other types of cabinets for computers and other electronic components that require EMI/EMC shielding. Referring to FIG. 1A, a principle the wall of enclosure is shown which is the wall of a shielded enclosure made of a conductive material, with the greater sizes of apertures causing a greater amount leakage of the electromagnetic fields. In an embodiment of the invention known by the trade name of "TORTURED PATH™" the improvement reduces the size of apertures by strategically cutting, forming, molding, extruding, stamping and forming any manufacturing method which utilizes an electromagnetically conductive material in basically any application.

The present invention provides a less expensive EMI shielding solution than the way the current technology is implemented. This can be accomplished in various embodiments of the invention implemented "two" dimensions (namely two-dimensional considerations since nothing literally takes place in only two dimension) with sheet metal or flat extruded cut or stamped materials. The material could be cast, again, with a thin sheet metal—assuming that the structures cast, cut, or extruded are thin relative to the overall dimensions, considering that the so-called two-dimensional considerations have finite thickness. As the manufacturing goes into a molding process or casting, it creates a more even three-dimensional shape or forms metal out of the 2D planes and uses drying techniques to create overlaps and further "torture the path." Thus, a goal of this particular embodiment of the invention is to create small apertures. More particularly, the goal of this embodiment is to create apertures that are not only small but force the electromagnetic noise to change directions or to go through apertures that are small and make the path difficult for the EMI to find its way out (thus, the "tortured path.") This, of course, reciprocally applies to the susceptibility of the electronics inside the enclosure to electromagnetic interference from the outside as well. EMI, electromagnetic inference generally refers to what is projected outwards to the world and how it might interfere with other devices. However, for the purposes of this disclosure, the expression "EMI" also includes shielding from any devices that are external to the user and that are radiating electromagnetic fields which will cause interference on the product and this is where the user would be susceptible to EMI.

Wave guides are discussed above in FIGS. 1A-E, in which the depth of a channel or depth of an aperture causes an increased difficulty for the electromagnetic wave to get out for any given aperture size. The TORTURED PATH™ invention is implemented in a mold or a cast to create a three-dimensional pathway that does not allow EMI to escape or enter the enclosure, which may include a wave guide effect. But, again, the preferred and conceptually most effective tortured path for the EMI is a sinusoidal saw-tooth square wave, as shown in FIG. 2, but also may be any kind of irregular shape, as shown in FIGS. 11 and 12, whether the pattern is periodic, periodic and changing, or constantly changing in shape. However, the invention requires that the pattern not allow for the maximum aperture size to be sufficient for the electromagnetic waves to traverse through the material, whether it is inward or outward. This principle of the invention is shown in FIG. 2 as "effective length matters."

Prior art illustration FIG. 1B shows a phalange which is used like a channel with a gasket. This channel is in the base of a box or an enclosure and then filled with a gasket—a circular gasket in this case is a very common approach. Then a lid is applied that forces that gasket to deform and it will partially conform into the channel thereby forming a seal. If this "tortured path" concept is considered, as is seen in the illustrations of the present invention discussed below where a three-dimensional example is shown, the gasket can be partially or fully avoided by molding, casting, or machining a shape in which the top fits into the bottom. However, the fitting procedure generally includes more than the simple wave guide effect as shown in the prior art.

The invention uses the so-called tortured path feature in concert with or uniquely to create a shape that reduces the aperture size by improving the configuration of the metals fit together in particular configurations that provide the desired EMI/EMC shielding. In a preferred embodiment, a particular configuration uses sinusoidal three-dimensional scallops that are shaped in two dimensions and then shaped again into the orthogonal planes. The orthogonal planes have sweeping shapes that force the EMI to traverse through narrowed apertures for the use of shaping. Therefore, since the material around the chassis, (which must be electromagnetic conductive material because the EMI/EMC shielding won't work if it's not) shielding has to be in contact with an electromagnetic conductive material. Using a conductive material with this configuration means that the wave is trying to get through an aperture that is too small for it to emit or receive waves of a given frequency. Changing the shape of the cuts, it is possible to do that again in concert with either the wave guide, a seam that is a tongue and groove or a stamp so that you have an interlocking with metal that's hem-on-hem. But instead of just having the hem interlocking, this "tortured path" shape is created and fits them into each other with male and female opposing images with a gap. This does not require the invention to have tight tolerances because this gap can be relatively small compared to the allowable aperture size, but very large compared to the allowable tolerances. Because of this particular feature of the present invention, 100% reliability on assembly is a high likelihood.

Additionally, 100% reliability is possible in the performance with particular embodiments of the invention, because the medium is not vulnerable to compression or degradation over time. Additionally, there is not any material used as a gasket that will be ripped off and sheared, nor is there a gasket that will plastically deform. Beryllium copper, for example, can plastically deform. Additionally, any metal gasket, finger gaskets or finger stock can either deform through improper design or improper handling, whether that be in shipping or other in situations. Instead, by creating cuts or through two or three-dimensional cuts that control the EMI as a way to control the aperture size, there is nothing to deform. Furthermore, in the present invention, there is no requirement for physical contact, therefore there are no tolerance issues, deforming issues, no degradation over time and no environmental impact. There are no loose structures added. The invention provides an extremely cost effective EMI shielding solution because there are no added parts, no fasteners and no welds. Free-plated material may be used everywhere which are formed in the case of sheet metal, stamp and form and/or a few rivets which do not depend on contact which have no degradation over time and no environmental impact.

A prior art panel mount FIG. 1C, is shown as seen through a box or through the face may be adapted to particular embodiments of the present invention. With the preferred embodiment of the tortured path invention, this may be generally efficiently created, for example, with a panel mounted meter as shown. On the backside of the phalange that mates to the chassis, which adapts the prior art to implement the present invention by adding the TORTURED PATH™ shape on a plate behind the phalange. In the case of sheet metal, another piece of sheet metal can be used behind the flushed phalange that would be a ninety-degree rectangular shape on the front, which would also allow for aesthetically appropriate or pleasing patterns. Behind, the cut materials, sinusoidal, saw tooth, square waves, would fit into an aperture, again, of the mating shape with appropriate tolerances approximately 20-30 thousandths of an inch in a gap that follow the shape. Then, the negative of that shape would follow around and would just overlay on top of one another into the same plane. There would be just this gap of whatever shape was selected, reducing the effective length all the way around the perimeter and containing the EMI and provide sufficient shielding.

Figure 1E:
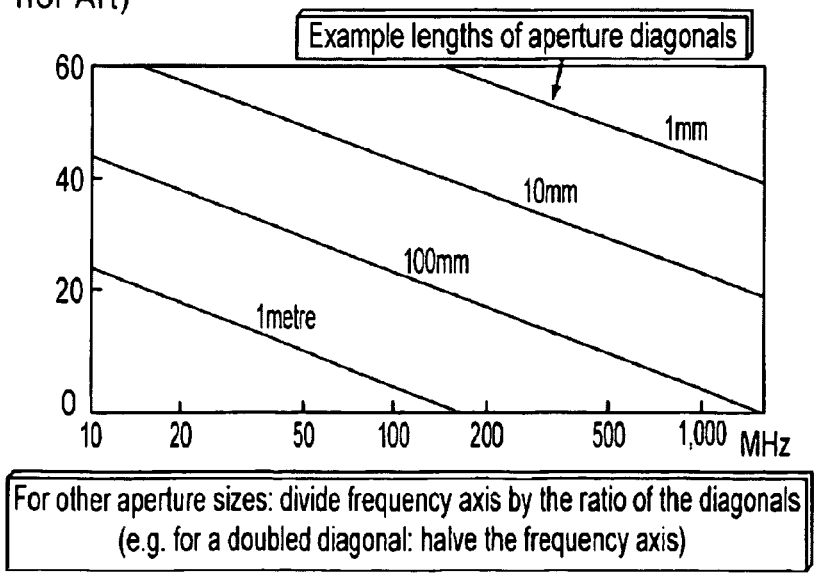
Figure 2A:
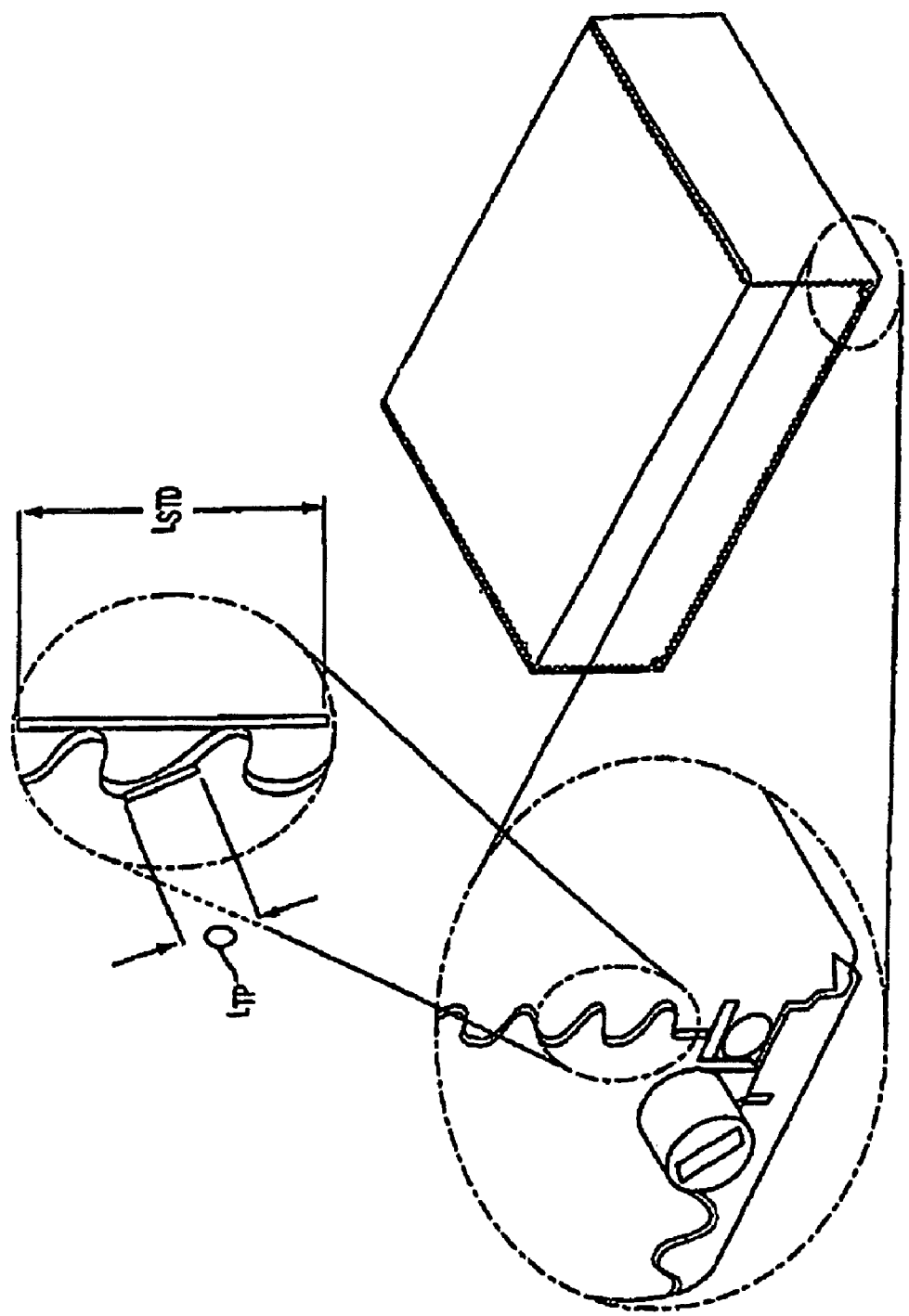
FIG. 2A illustrates a sample pattern in an enclosure as may be implemented in the invention that embodies the principle of "effective length;"

Referring now to FIG. 1E a diagram of the relationship between frequency and gap size is shown. As the frequency of the electromagnetic noise goes up, the allowable aperture size goes down in order to have adequate shielding. Obviously as the frequency goes up, it is necessary to have smaller and smaller gaps. In this way, tortured path, if the sinusoid was used, for example, the wave length may be shortened and the amplitude lowered in order to create a gap appropriate for a given frequency. It works well because it is below the allowable half wavelength of the range which is typical for shielding applications. For example, at a range of land over 50 to lambda which is over 20 wavelengths at a given frequency, divided by 20 to 50 in that range. As an example, the FCC regulates up to two gigahertz and in that range, it's lambda over 50 equals three millimeters, land being equal to 0.15 meters or 150 millimeters. Divided by 50, it's three millimeters and divided by 20 is 7½ millimeters. Even in the case of sheet metal where you have bends and other abnormalities of shape, it is still easy to manage all tolerances of bends with a 30,000$^{th}$ gap, which would give basically 100% reliability on assembly but only be 30,000$^{th}$ wide. Additionally, if such a situation is compared to three-quarters of one millimeter, such that there is a wave that's three or four times this size, it still stays within the three-millimeter range at four times that size. Such a gap would not allow the adjacent peaks or valleys of that wave to be seen, so the effective length would basically be the traverse; the traverse would go not quite from peak to peak but partway from the peak to part way to the valley, sort of down the transition from peak to valley in the wave and still well within the three millimeter requirements.

Very short wavelengths or very small aperture sizes are allowed in this way but do not require anything other than a stamp and a form. In a case of a mold, it is possible to run that much tighter. It may be narrower than 30,000, in sheet metal. That's very generous and it makes an almost perfect assembly. It is possible to reduce it to 10 or 15 thousandths and there would be no issue. This remains true if all of the cuts are retained so that they're not visible and, if it's not exactly the male and female, which don't fit exactly following each other, as long as they stay within that gap, it may be slightly irregular. For example, one peak might be a little close to the valley, but it won't cause interference and, perhaps, it could even cause an intermittent contact which might enhance the electro-conductivity.

FIG. 1E refers to the shielding effectiveness versus the frequency. Therefore, if you look at a 10 millimeter gap, for example, it's showing that 20 decimals of shielding with a 10 millimeter gap at one gigahertz are possible, approximately. For most electromagnetic packages, in the case of a sheet metal enclosure, it is rare that a sheet metal enclosure will produce more than 20 DB of shielding the enclosure. In this one example, a 10-millimeter slot will provide 20 DB of shielding at one gigahertz. In this case, the sign waves easily constrain the gap to be anywhere half of that size. At half that size, at one gigahertz, based on this chart, it might be up to about 35 DB, which is significantly above the shielding of any normal chassis. Now, of course, that's based on one aperture. Therefore, it may be necessary to degrade that by the 10 law again, where N is the number of total apertures. But it takes 100 apertures—the 10 law again—to have a 20 DB degradation in shielding. So with a five-millimeter slot, which we could easily provide, one gigahertz, would be about 30 DB of shielding. So even with 100 of those, there would still have 10 DB of shielding; there are many enclosures that exist that don't have far in excess 10 DB of shielding. Certainly, in consumer desktop PCs that is what would be expected more often than not in the chassis. So, again this invention proposes a solution with no gaskets, no screws, no fasteners, and just a few rivets and with basically no degradation of performance over time and with no compression set, only a gap.

Looking at FIG. 2, the first model of tortured path as shown in "effective length," a model is shown where the LSTD is the old standard length of a slot. If it was a straight slot, that gap would be, as shown, compared to length of the tortured path, which is the longest straight line distance that the electromagnetic interference can see through the sinusoid. The length standard and the strength slot would be somewhere in the order of eight to 10 times the length of the tortured path. And all that has been done is a stamp and then a subsequent form or stamp which is brings the male and female image of these two slots together. This is achieved alternately with a small width and large width so the smaller male fits inside the larger female, back and forth, whether that's saw-tooth, square wave, sign wave or some intermittent pattern of those and other shapes. As shown, it is possible to reduce that effective length economically and efficiently at virtually no cost.

Figure 2B:
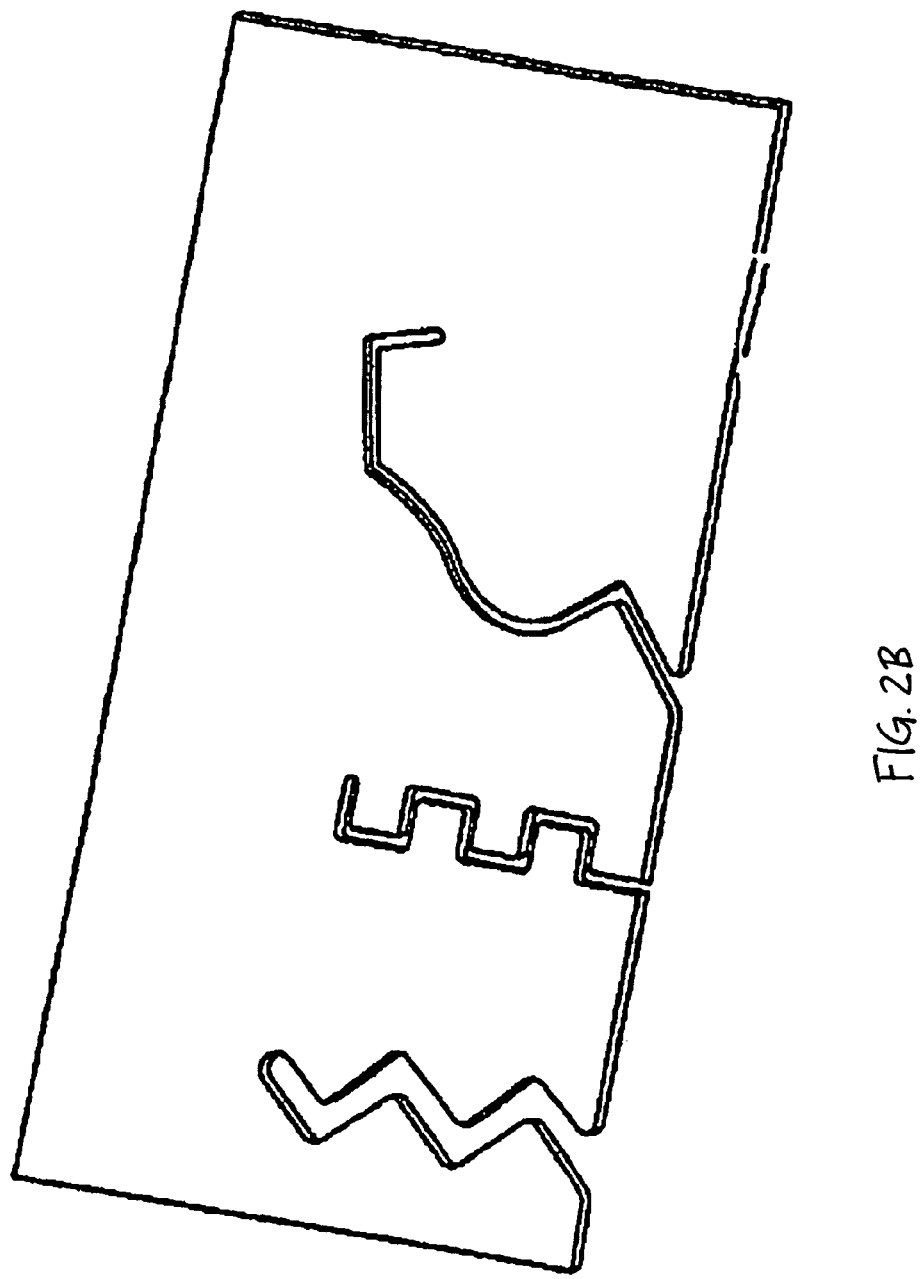
FIG. 2B illustrates a side of a computer enclosure in another embodiment of the invention, or three cuts in the "four-cut" or TORTURED PATH™ solution.

FIG. 2B illustrates an alternate and illustrative embodiment of the invention, known by the trade name of The TORTURED PATH™ EMI solution. Three cuts are shown in various shapes in the illustration, and four are used in a first type of the alternate embodiment. However, the cuts may all be of one type of cut, in appropriate patterns, such as sinusoidal, square wave, and certain Brownian-motion type cuts. The TORTURED PATH™ EMI solution provides a potentially complete EMI shielding solution in alternate embodiments as long as the four lines are placed to prevent any "snaking" of the sinusoidal wave propagation WP. FIG. 2B shows a couple examples of the different types of shapes. A triangular saw tooth-type cut configuration is shown. Again, the wave(s) are not able to seen by the peaks so it will look for the straightest line it can find. So it's just "tortured" in that it cannot see around the corners. The square wave is then seen and then a very odd bent paperclip-looking shape wave, a cut is seen. Any cut imaginable can be used. The goal is to try to reduce the effective length of any slot that can be used as antenna by the electromagnetic interference. So this can be used around I/O devices. This can be used in sheet metal. This can be used in extruded, molded or casted cuts in any shape. It may be used in sort of a modular into a chassis or around the back phalange of a model. It may be used around the input/output devices, in any manufacturing method or in any electromagnetically conducted materials for which EMI needs to be contained. The TORTURED PATH™ solution reduces the effective length by strategic cuts, shapes or molds or extruded shapes and, in addition, goes three-dimensional through drawing and overlapping, again, torturing the path. Even bringing together a wave-guided effect, The TORTURED PATH™ is the essence of the invention and it can efficiently be implemented in the present invention with complementary forming techniques or molding techniques that don't require additional costs.

Figure 2C:
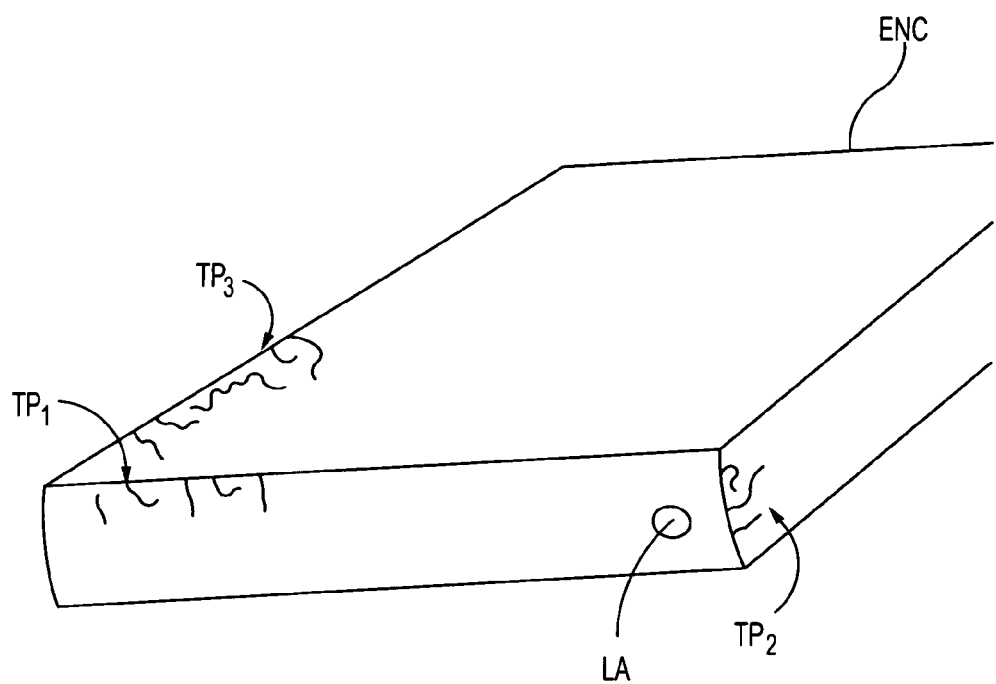
FIG. 2C shows illustrative tortured path patterns cut into a sample computer enclosure.

Illustrating how effective the above-discussed shielding principles are and how versatile the manufacturing applications can be applied FIG. 2C shows that the sides of an alternately cut computer enclosure can have any number of non-periodic patterns, the TORTURED PATH™ enclosure. FIG. 2C is an example of an alternate embodiment of the invention in which a non-periodic pattern NPP around the edges of the enclosure ENC create the desired EMI shielding.

Figure 3A:
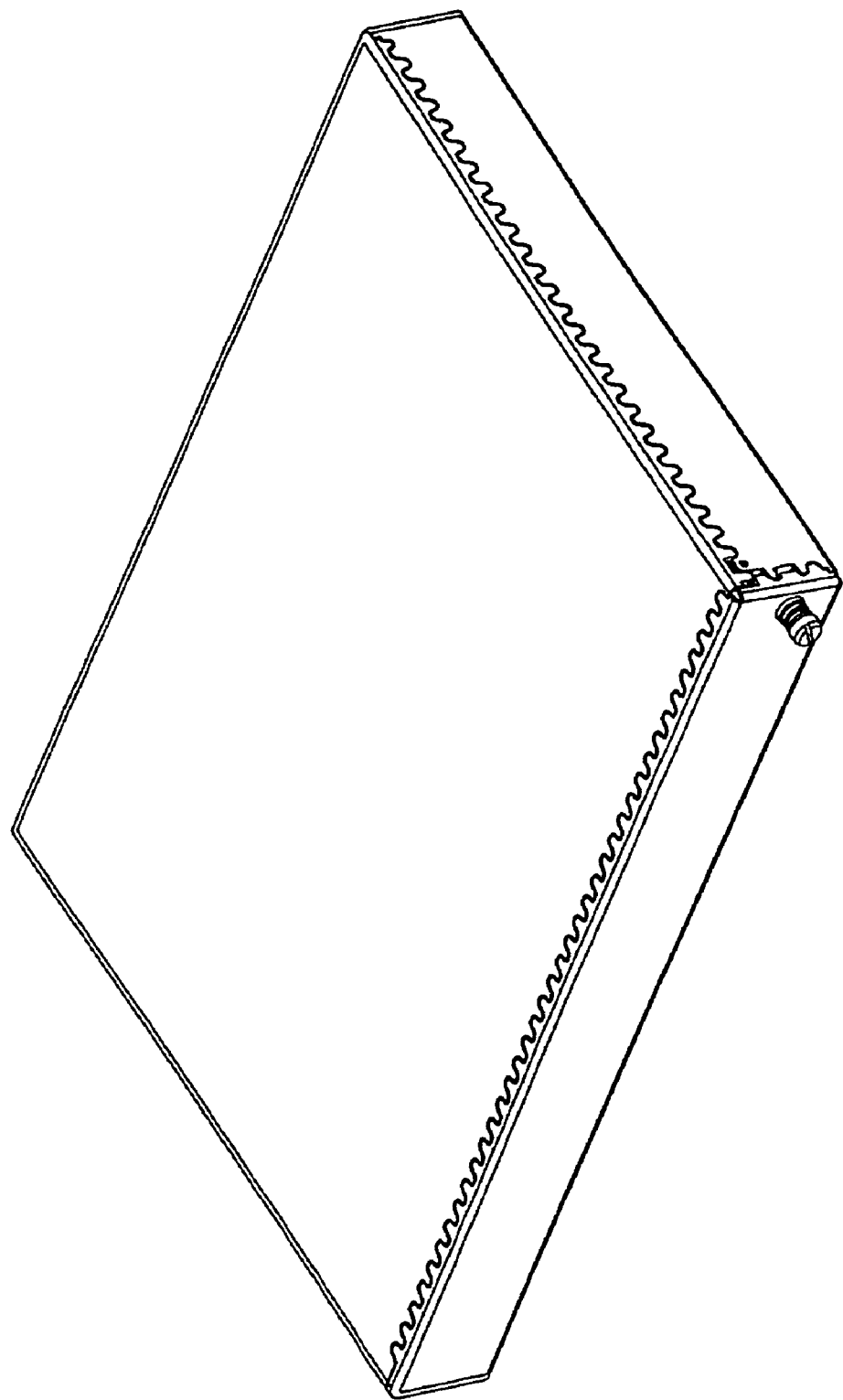
FIG. 3A illustrates a preferred embodiment of the inventive computer enclosure from a top-side view.

FIG. 3A is a top view of a first example or embodiment, a three-sided and three-sided bar where the one three-sided fitting is down over the other and it comes straight down from the top. Then, the EMI/EMC is just deflected in front and back in order to overcome any interference between the sign waves. So it is possible to bring the two U-sections together, having The TORTURED PATH™ seam running along six different edges to bring the two three-sided boxes or sections together.

Figure 3B:
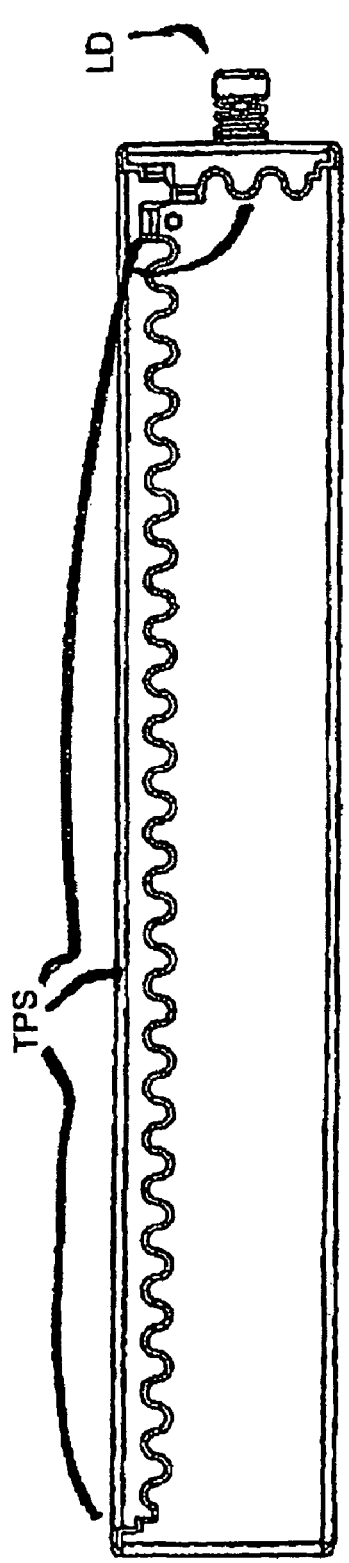
FIG. 3B is a close up the preferred embodiment of a purely two-dimensional solution.
Figure 5:
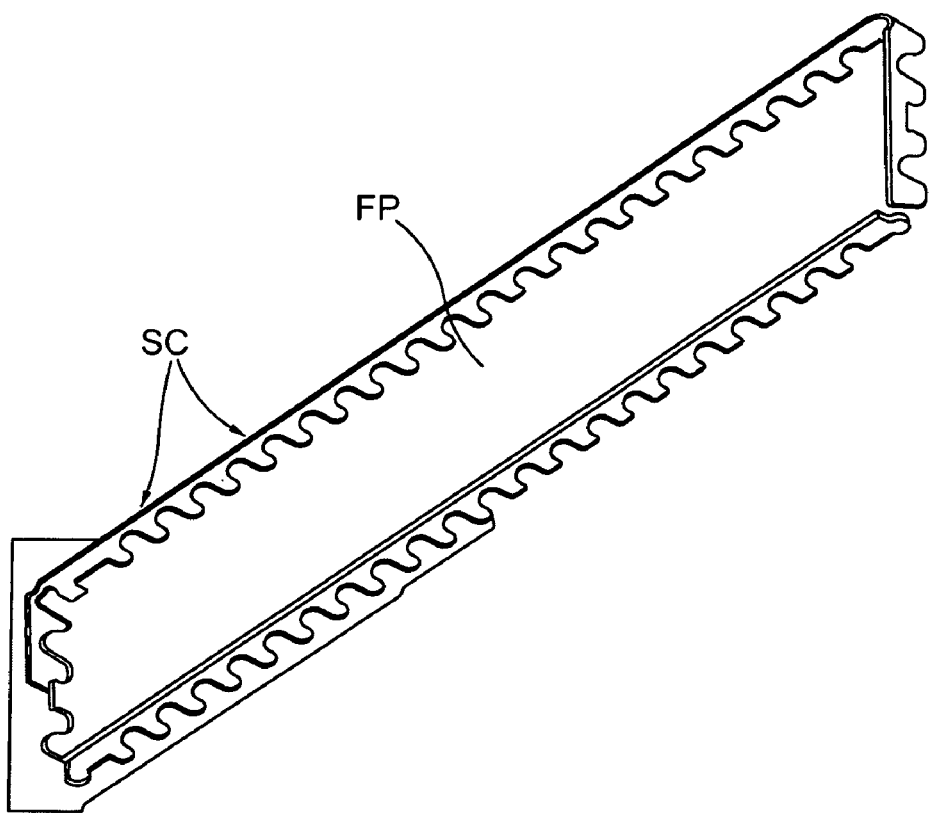
FIG. 5 is a side view of a front panel component in an embodiment of the invention.

FIGS. 3A and 3B illustrate a sample of the first embodiment or "generic" "one-hit" solution embodiment of the invention for PC enclosures and other "boxes" that provide a great deal of advantage in the manufacturing process over current methodologies. FIG. 5, discussed below, illustrate further embodiments of the invention in an alternate "PC Box" EMI shielding solution. The wave strip structure(s) IWG and OWG, respectively, are formed or attached to the box, or manufactured with the box, and provide an inexpensive and easily implemented EMI shielding advantage.

FIG. 3B is a side view of the three-and-three configuration. This demonstrates again an example of the manner in which The TORTURED PATH™ seams run along the edges of the box.

In most embodiments of the computer enclosure applications of the invention, the invention requires a simple stamp or cut and form fabrication in sheet metal (for that particular embodiment). The invention is less expensive than "spoons" and does not require physical contact which therefore provides greater reliability.

Now referring to FIG. 3A (known commercially as "model 3"), a model of the preferred two-dimensional embodiment of the computer enclosure configuration is shown in a 4×1×1 configuration (That is, preferably a three-piece assembly in which 4 sides or walls are included in the main "sheet"). An example of a one RU 17½ inch wide chassis, approximately 11½ inches deep, which would represent a classic kind of configuration for a standard 19 inch rack, 17½ inches wide allowable and one RU in height. The TORTURED PATH™ seams run along the sides. This is a front isometric view, looking at the front right-hand corner in the foreground. The seams would run along the top of both sides, the top of the back, down both back vertical corners near the corner, but on the backside. All four sides are around the faceplate, but none show on the front section at all. So aesthetically, no apertures are in the front, although aesthetically these could be enhancing at some point and that's something that may be discussed.

Such apertures could be used ergonomically, aesthetically or they could be used to cut the logo of a company, if done properly, adding an economy to the manufacturing process. Such apertures could also be used for implementing TORTURED PATH™ shapes to create air inflow in a manner which would help to control the EMI. So in the particular enclosure illustrated in FIGS. 3A-3F, there is a four-sided base (the "4" in the 4×1×1) where in the flat pattern configuration, it would be a four-sided box. It would have a TORTURED PATH™ shape around the perimeter of all four sides. In between the back and the two side sections (the "1×1" in the 4×1×1), which could be phalanged over (a preferred assembly process), it would fold up and phalange the sides into the back panel. Fastening requires only a rivet is in each, and optionally a rivet in each of the back corners. Thus, the process would be stamp, form, and two rivets for the total assembly and no gaskets, no welds, no screws, which could all be done in pre-plate material.

FIG. 3A also illustrates the preferred embodiment with a separate lid that comes down that goes over the back and both sides, again, with the TORTURED PATH™ features assembly. These particular configurations allow for easy addition of joining tabs in order to rivet the top to the base or it can use a counter-sunk screw, avoiding "intermittency" problems from a standpoint of electro-magnetics, which could also augment the electromagnetic advantages of the present invention. This is contrast to a standard enclosure situation with a straight slot where it's necessary to have the screws at the same spacing as the maximal allowable aperture. With this configuration of the present invention, the spacing might augment the TORTURED PATH™ EMI/EMC shielding solutions and also be used for structural integrity and/or be just for the enclosure to maintain the enclosure.

In the configurations shown in FIGS. 3A-3D, the 'nose' or the front faceplate goes over all four sides and can be tapped and can control the entire assembly. In this way, it is possible to actually put the lid down in a configuration where it is actually hooked rotating, in a tongue and groove kind of hook. It is possible to bring it down and capture all the assembly strictly with the faceplate. Basically, there would then be a stamp, a form, a friction fit and then just the lid would be captured. The sides and the base would be captured by the nose cone. In this way, the entire assembly is brought together. While such a process may not provide all the structural integrity that was needed for all end-uses, in many cases it would certainly be adequate. There are many configurations for which this could be done. The EMI can be contained and basically element fasteners eliminate welds and gaskets at a very low cost and additionally provide thermal enhancement. So it would therefore be additionally cost reductive and, thermally enhanced because of the ability to now open up more apertures and would be environmentally friendly, without any addition there. One hundred percent of this is assembleable and 100% reliable with no degradation over time. It could be quarter turn, but in this case, a simple captive—spring loaded screw that can be taken into a pem-nut on the back of a phalange is pivoted off of the side wall. One of those is at the front and both ends of the chassis where there may a split shear on the one side and just the positive locking on the other.

In this configuration, the phalanges come down from the top to the sides and back. In this way, when the lid is off, there is a wide-open exposure to fully populate the inside of the box without any interference. None of the top view looks downwards and it is not covered by any material. Therefore, there is full access to the box. In addition, this could also be done as a four sided box and a two sided box where the top is included as part of the whole front. This could also be done in a two-part assembly instead of three. In the case of a 5×1 type of the embodiment, this configuration is very straightforward. This embodiment may also be implemented as a two-part assembly and a 3×3 channel box which is also a two-part assembly. Thus, 5×1, 4×1×1, 4×2, 3×3, 3×2×1, 3×1×1×1 are all assembly configurations contemplated by the invention. (A 3× component is shown in US Application Publication 2006-96773 (assigned to the present application) and can be used in 3×3, 3×2×1, 3×1×1×1 applications, and designed for the specific needs of the end user and other manufacturing requirements in addition to retrofit considerations).

Figure 3C:
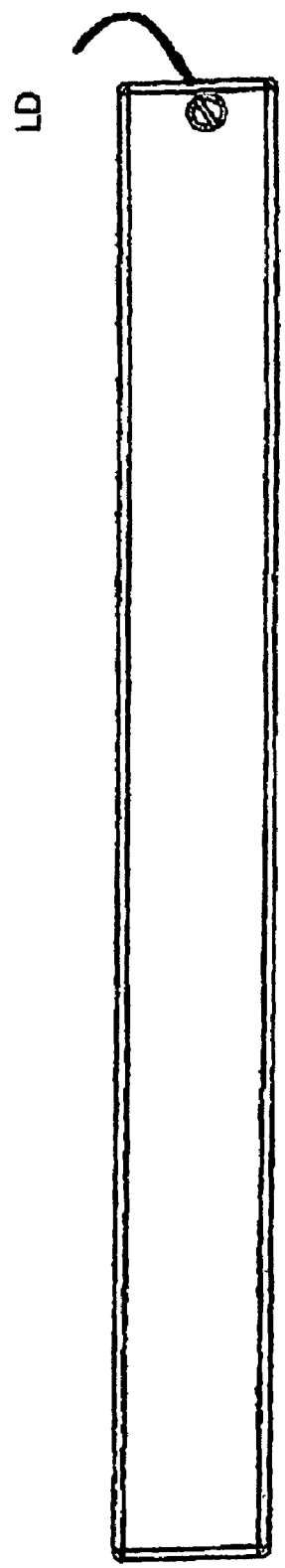
FIG. 3C is a side view of a preferred embodiment.

FIGS. 3B and 3C show side and front views (at the bottom) of the primary 2-D Tortured Path™ EMI shielding solution. Aesthetically, the tortured path seams TPS on the front are required. From above, a side view is shown as it runs along the top and down the front side edge. This illustration demonstrates the rotational fastener which has the captive fastener for mounting the box. It could be a positive quarter-turn lock in which a paddle goes behind a phalange. A simple screw or perhaps a different appropriate latching device could be used without departing from the spirit and scope of the invention. The enclosure system may have a variety of different approaches which can range from the very simplistic assembly approach to a more complex one. A simple assembly is cost effective, while providing high reliability and is excellent for minimization of assembly cost with virtually no assembly or welding. This can be done with any material in any manufacturing method—any electromagnetic conductive material and any manufacturing method. In cast, molds, etc., a three dimensional tortured path is possible, just by simply molding or casting. In an extrusion, The TORTURED PATH™ is cut into a shape as it is extruded and used for airflow and EMI container.

Figure 3D:
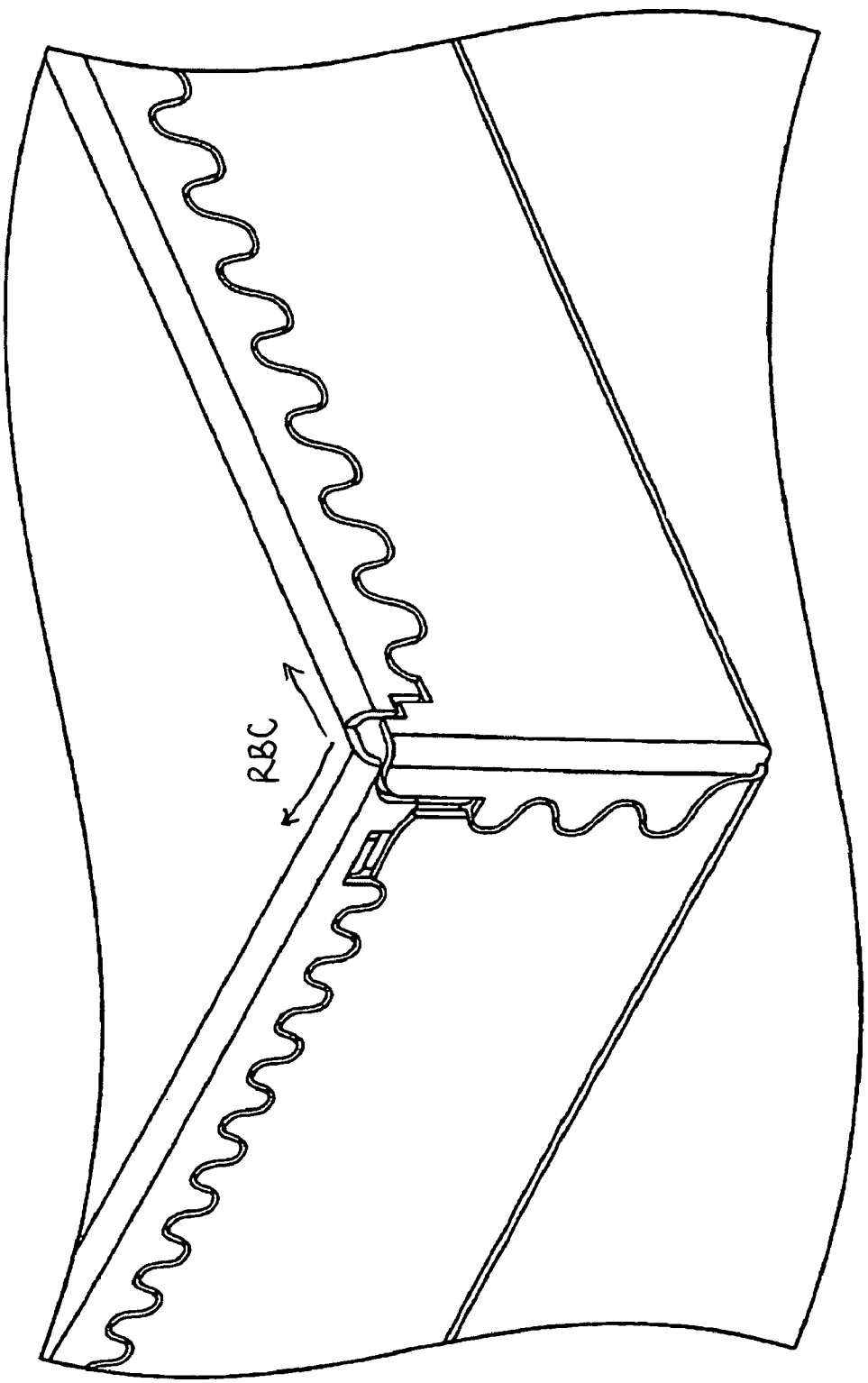
FIG. 3D is a top side view of the features located in the "main" or locking corner of a preferred embodiment of the computer enclosure.

FIG. 3D is a top view of that same assembly. Again, from the top, there is just one line across the top-front that is shown which would be exactly the same on the bottom. There is one line on the sides and also at the front that runs up and down the 1-U dimension, both at the front and back and which is all that can be seen from the side. Along the top edge of the side and on the back of the top edge, both seams are seen, near the corner on the back of both edges.

FIG. 3E is a view of the isometric of the rear back corner and the TORTURED PATH™ edges. The edges run along the top, side and down the back corner of the base of the chassis and both edges of the lid come down into that corner. FIG. 3E shows an exemplary corner in detail. At the close-up of the front right corner, there are formed tabs that are bent down and go up one plane and around behind the other plane. In this case, there is one formed from the lid that goes behind the side wall. The side wall goes behind the front face and the front face also goes behind the lid, creating a "three-way convergence" or locking corner while maintaining all the EMI shielding features along the 2-way seams. These three pieces come together but they nest over and under each other so they're all interlocked without using any fasteners. This further reduces manufacturing cost. In each case, the slot length goes around these tabs (or it goes around the phalange which is for the mounting screw) and therefore the length is kept below the allowable length for a 2 GHz EMI shielding or whatever particular frequency is selected for control. A hole on the top right provides additional flexibility in this embodiment of the present invention and allows a rivet to be used to adjoin the lid to the base. In a configuration without a removable lid, a counter-sunk screw may be used. In this case, removing the lid and taking the face right off. As illustrated by this principle, a particularly attractive feature of the present invention is that no matter what feature is surrounding The TORTURED PATH™ solution in this embodiment of the present invention, it is implemented in such a way that a minimal aperture length maintained and therefore controls the necessary EMI.

Figure 4A:
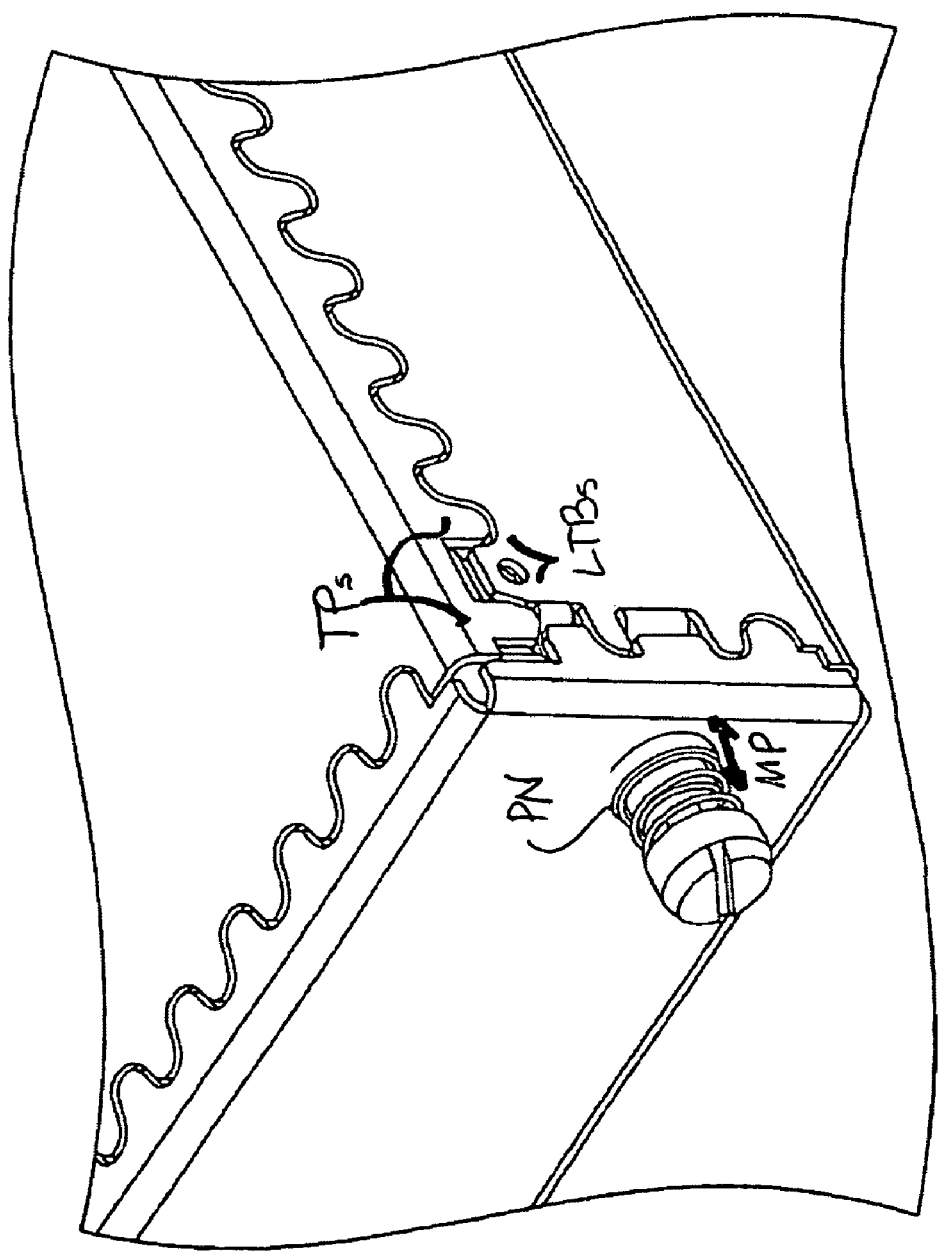
FIG. 4A is a top side exploded view of the features located in the "main" or locking corner of a preferred embodiment of the computer enclosure.
Figure 4B:
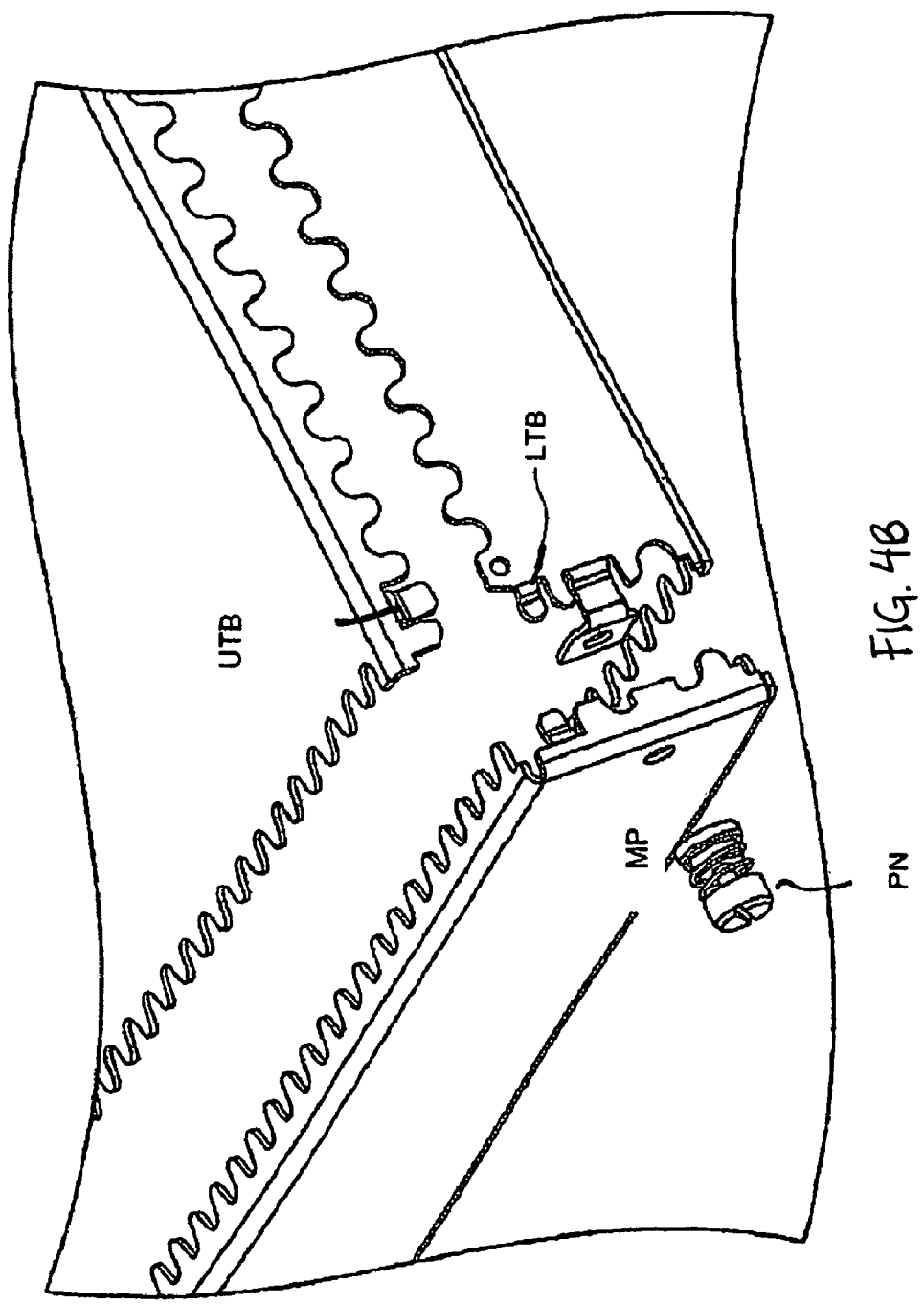
FIG. 4B is an exploded view of the features of the "locking" corner of the preferred embodiment and manufactured attaching solutions.

FIGS. 4A and 4B show assembled and exploded views, respectively of the same front corner of the 17½ inch (in a preferred embodiment, but dimensions are dependent on end-use) 1-RU box and it shows how the tongue tabs UTBs and LTBs would over-lock and interlock with one another. In this way, the tabs bring the entire assembly together, which is sort of a tongue and groove style. An excellent assembly for minimizing fasteners would help to align the chassis and could bring some electrical contacts together, although it is not dependent on this alignment for an appropriate EMI level. Also, here it uses captive fasteners, both in the screw or the retaining screw. Additionally, there is a pem-nut PN, which is mounted to the back of the mounting phalange MR This shows that once stamped and formed the features are very simple and provided at a very low cost. This is a highly effective manner for fabricating, assembling, and maintaining EMI which is a low cost, high performance and excellent solution.

FIG. 5 shows the front plate component FC of the preferred embodiment of the invention from front and top views respectively. Needless to say the single front plate can be used in a 4×1×1 embodiment of the invention, or a five-sided component in an alternate configuration for a 5×1 embodiment of the invention. The sinusoidal cuts or stamp(s) SC are included on the interior sides of the front-plate component FC of the enclosure and may optionally include the fastening mount AFS, which is discussed above.

FIGS. 3A-4B illustrate that the solution provided in the computer enclosure applications of the present invention can be implemented with ease in all major manufacturing methods including: stamped, laser cut, cast, extruded, molded, etc. In each manufacturing method, almost all of the benefits of each (detailed above) will apply. Because there is a "gap" between mating components, the tolerances in the fabrication process are as "liberal" as possible. The liberal tolerances further accentuate reliability and ensure the highest possible yield of parts off the manufacturing line, so that generally, there are no fit issues. Further, the "one-hit" TORTURED PATH™ solution can improve packaging flexibility and thermal performance as well. For example, the inventive solution may be used not only for chassis fabrication, but also for modules, FRUs, connectors and other I/O components that require EMC protection/shielding. The inventive solution to cut shapes to provide great open areas for airflow, does not adversely impact the EMI performance and leads to the conclusion that manufacturing cost remains low, while thermal performance remains high.

In FIGS. 3A-4B, a preferred embodiment has a diameter of 0.18 and 0.24 inches. The diameter is 0.18" and the values are at 0.24". But the dimensions are details that must be optimized depending on end-use which is not something that is required for implementation of the present invention. For two gigahertz, the rule of thumb is between a three millimeter and seven millimeter gap. When using 0.18 and 0.24, it is about six millimeters. In general, forty-two thousandths is a standard gage for a "z-axis" dimension. However, such a dimension is not relevant to the spirit of the present invention, rather a random choice and one that is used frequently by skilled artisans for purposes of convenience and economy. But if one follows this path, it is a 0.24 diameter and one probably ends up close to a diameter. If the two parts together are put together, the slot would probably come very close to the diameter. Finally, when examined from up one side and over the other, the straight line is seen, it would be about six millimeters, which keeps it inside the desired range in a preferred embodiment for a purely two-dimensional EMI shielding solution.

If the metal is inexpensive, some of the metal might end up wasted, because the process is similar to "coining" and "oil canning." This means that the tolerance is tightened up because the smaller these get, the less of a gap that is necessary. Consequently, there must be a tighter tolerance, so it is advantageous to keep it fairly generous.

To effectively implement the EMI shielding features of the two-dimensional shielding solutions in a preferred embodiment, if the apertures are cut with maximum efficiency, the EMI will be without any antennae that it needs to radiate, even though the thermals will open up (hopefully not at the cost of EMI performance).

Similar to enhancing thermals, lowering costs relative to gaskets, screws, welds, etc. is one hundred percent reliable. There's absolutely no reliability degradation over time. When these two things are brought together, there's an air gap. There are no compression setting gaskets. There is no deforming or bending of beryllium copper. There is no separating of foam over fabric gaskets, which separate. They are sheared, they separate, and they're bonded with adhesive or something similar. When they are sheared, they may fail. The compression is set over time and they lose performance over time.

In fact, beryllium copper is outlawed in Europe. It bends and spoons bend, and they depend on physical contact. This, however, doesn't depend on physical contact. It's 100 percent reliable over the life of the product. Additionally, with the gap size set right, where the gap size is twice the total summation of the geometric tolerances, it will fit together in sequence, providing a "never-fail" assembly with virtually no assembly defects. This is designed to have zero assembly defects. It will always assemble and it will be 100 percent reliable.

Twice the geometric is the normal summation of geometric tolerances. If there is a gap which is double, there will be 100 percent margin of safety against any assembly error, any assembly defect. In this embodiment, there is an infinite safety and an infinite reliability in assembly. There will be no assembly errors.

The present invention provides a solution with no waste or failures in assembly. A face plate will not bind or crash in front of a customer. Inspection can be eliminated and result in lowering costs. It is environmentally friendly with zero impact to the environment. All pre-plate material can be used which is very important. Pure pre-plate may be used with no concern about post-plating anymore. All the entrapment issues and the environmental issues associated with the cost are eliminated. With post-plates, one must take all the sheet metal. It is necessary to ship some of it to somebody that plates it, to get it all plated and packaged up properly so it doesn't get all scratched. However, in this case, this can all be done with pre-plate material, 100 percent. The only process is to ship it and do the assembly.

Assembly is simplified because, there are no welds necessary or any post-operations. When welding is part of the process, there must also be post-plating because it is not possible to weld pre-plate. It would ruin the plating. Otherwise, if there is a weld and then the post-plate, the whole thing must be mapped. The problem is, if there is a map with a post-plate, if there are any hems, the result is entrapment; with entrapment, there exists a source for oxidation.

So if the plating material is entrapped, it just sits there in the gap, or it doesn't get in at all. It either gets entrapped or it doesn't penetrate and if there is enough safe oxidation, there is corrosion. In this embodiment, that's all eliminated. Therefore, pre-plating is optimal. Everybody wants to get there and this is facilitates that. It also facilitates commodity.

If this is set up right, then the end-user can just take the box, expand and grow it and then has all of their seams and everything done. All they have to do is set it up correctly. In other embodiments, there does not need to be a "tortured path" in the front. It moves all around to the sides, so one has this box that can be expanded or grown in any sigma or any RU or any depth, for a 17½ or 24 inch rack, for example. The box is expanded and the performance increases. All pre-plated, no screws, no assembly, a few rivets and its done. Its 100 percent reliable with zero assembly defects.

Figure 6:
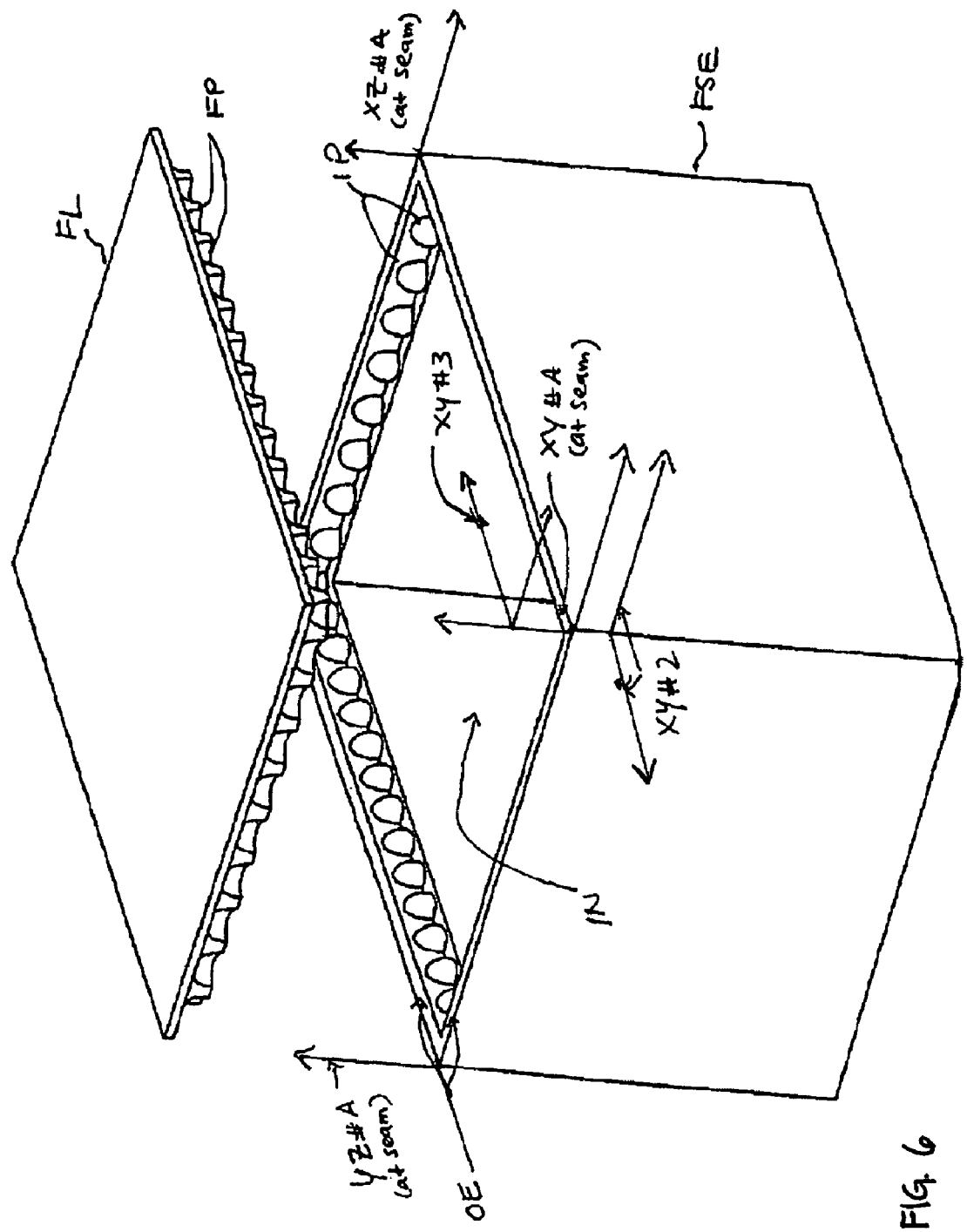
FIG. 6 illustrates a simple electronics enclosure for a (purely) three-dimensional EMI shielding solution using partial spheres or "scallops"

FIG. 6 refers to a sample three-dimensional EMI-shielding solution for an electronics enclosure in a basic embodiment, (such as referred to as the "three-dimensional tortured path solution") with the "shell" or "scallop" embodiment of the invention. The three-dimensional patterns are formed or otherwise configured such that they are generally going the inside periphery of the edges, and the two parts FSE and FL come together and the "sinusoids" meet. All that is necessary for the implementation of the three-dimensional implementation of the invention is to "cut" or stamp the edge of the metal and make the same cut and they come together with a "30 gap" or something similar. The advantages of the primary embodiment of the invention include, inter alia, the fact that there does not need to be any contact and therefore no degradation over time. The parts FSE and FL don't have to make physical contact. Further advantages include that there are no tolerances to consider and there is nothing to deform.

The basic three-dimensional embodiment takes advantage of the manufacturing ease of using a two-part enclosure including a five-sided enclosure FSE with an interior volume IN for housing electronics and a flange FL, which fits into the five-sided enclosure upon completion. In this particular embodiment, either the box or the flange could be molded or cast, and thus "three-dimensional tortured path" or a TORTURE CHAMBER™ is illustrated. In general, the electromagnetic interference cannot get in or out of the electronic enclosure. In the preferred embodiment shown, there is a (periodic) quarter sphere with a half cylinder-type shape IP, although, as can be appreciated by those skilled in the art, many other types of shapes would be sufficient for providing the necessary shielding, and some are briefly discussed below. In the illustration, the female three dimensional shapes FP in the "lid" or flange FL or mate with the male protrusions IP along the perimeter of the lid at the lid-to-box interface OE, which is generally the XY plane formed at the seam of the junction between the lid and the box (not shown), labeled as plane XY (#A). Even though there can be adequate spacing between the box FSE and the lid/flange FL, the shielding is provided well inside the allowable for the frequency that are generally desired for shielding.

The three-dimensional EMI-shielding solution includes an interior pattern IP of three-dimensional shapes which are stamped, cut, molded, extruded or otherwise configured into the five-sided enclosure FSE around the perimeter of the top or open edge OE. The interior pattern IP as being semi-spherical and "male" or protruding into the interior volume IN, however, in other embodiments the shapes could be reversed or "female" without necessarily departing from the spirit of the invention. The flange FL also includes a pattern that is "complementary" to each other such that the box and the phalange will seamlessly fit as well as provide sufficient EMI shielding. Further discussion regarding three-dimensional EMI shielding solutions is provided in PCT Application Publication WO/06-26758 (10.1.2006), assigned to the present applicant, and which is incorporated by reference for all purposes.

Figure 7A:
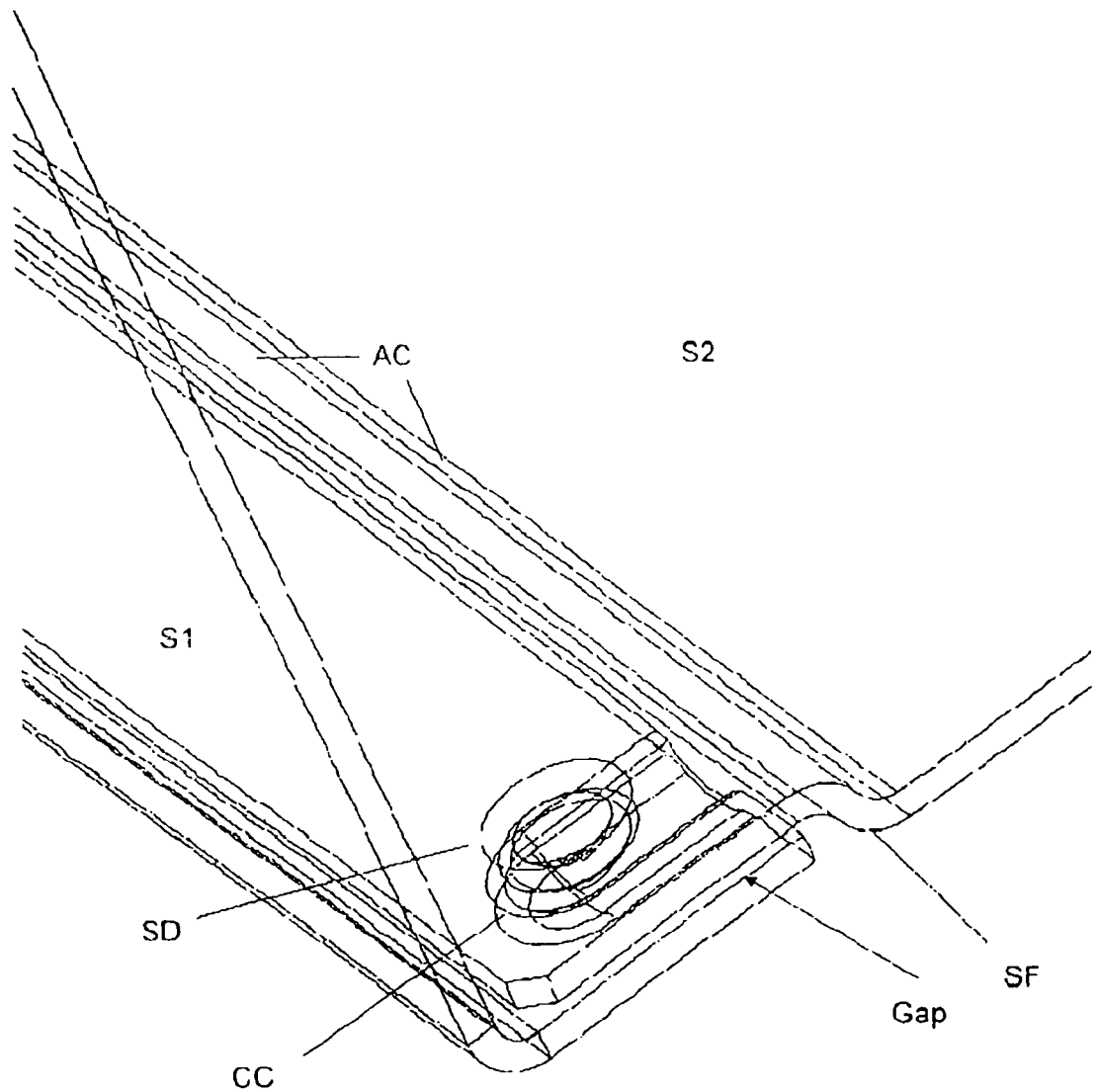
FIG. 7A illustrates a "hybrid" 2D/3D embodiment of the invention, using raised shapes, as the enclosure may be created from a sheet metal.

Referring now to FIG. 7A, a first "hybrid" embodiment of the electronics enclosure is shown, in which both two-dimensional and three-dimensional features provide EMI benefits. In this case, a simple overlap lid with a stepped-in base is seen, including the features that include the "dome" and the "dimple" which are used to provide the electromagnetic interference shielding. S-D is the dimple; C-C is the dome that fits over it. The gap would be a nominal perhaps 10 thousandths, whatever is appropriate for assembly, and that gap will dictate what the volumetric space that the wave would have to negotiate, and it would be reflected and absorbed as it traversed (traverses) between the cylinder structures and the dome structures, the dimple.

Referring again to FIG. 7A, structure SE-1 just reflects the top surface of the lid. Structure AC are the stepped-in bend corners of the base where it steps into accept the lid over top of it. The structure (configuration) referenced S2 reflects the side wall of the base. The structure referenced SF is, again, the bend channel as it bends in to allow the lid to come over the base. The waves are forced to negotiate between the side wall and the fringed-over section of the lid.

Figure 7B:
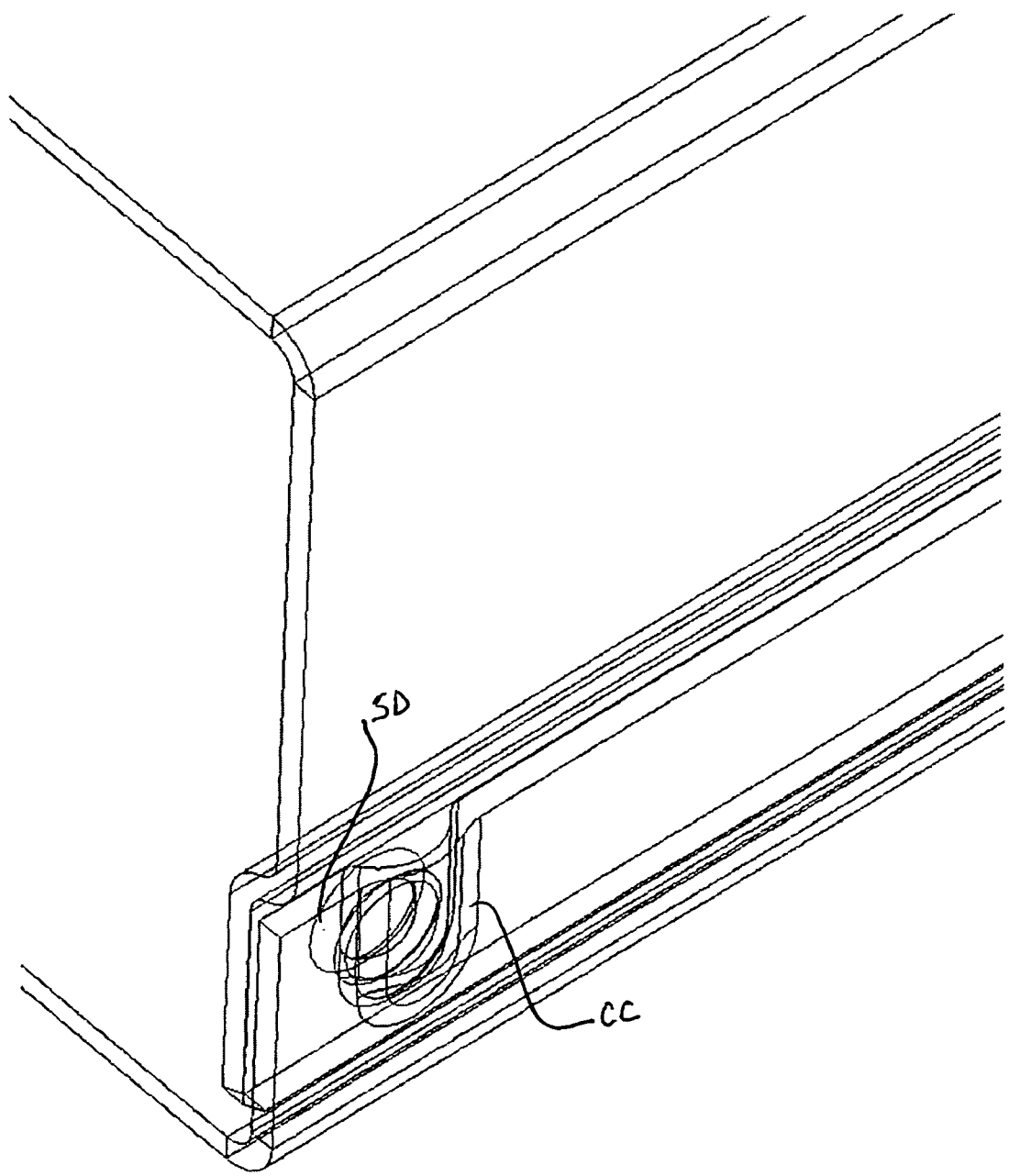
FIG. 7B illustrates a detail of the "hybrid" 2D/3D embodiment shown in FIG. 6A.
Figure 8A:
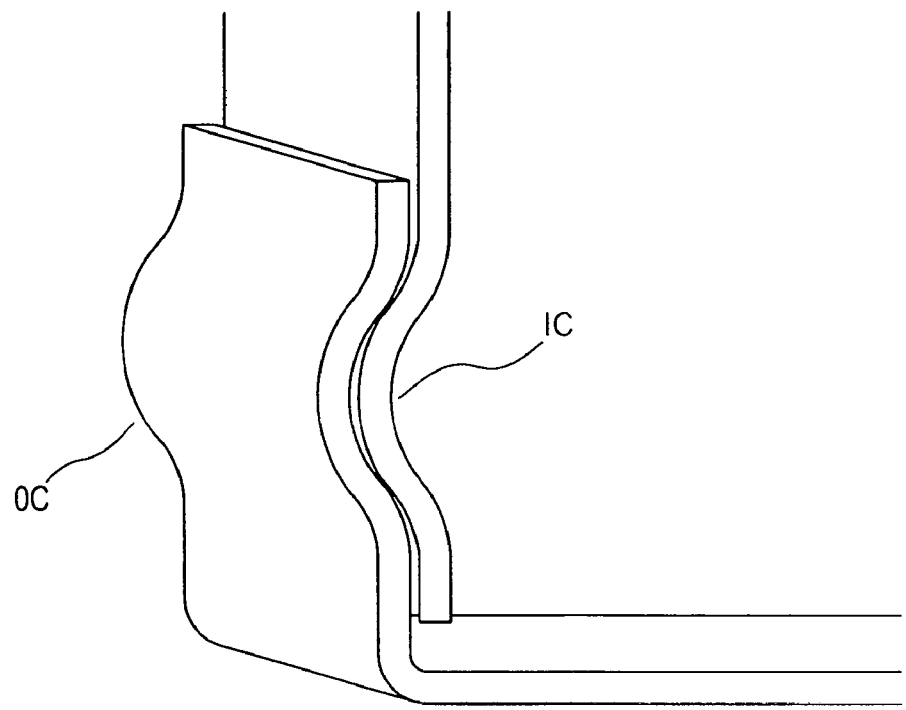
FIG. 8A is a detailed perspective view of a "trough" feature in the 2D/3D hybrid computer enclosures.
Figure 8B:
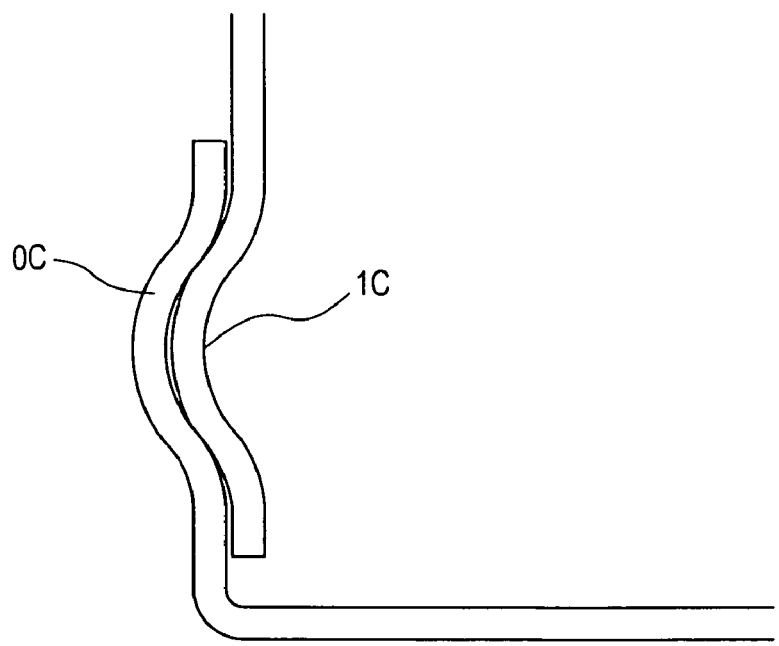
FIG. 8B is a side view of the trough or channel feature.
Figure 8C:
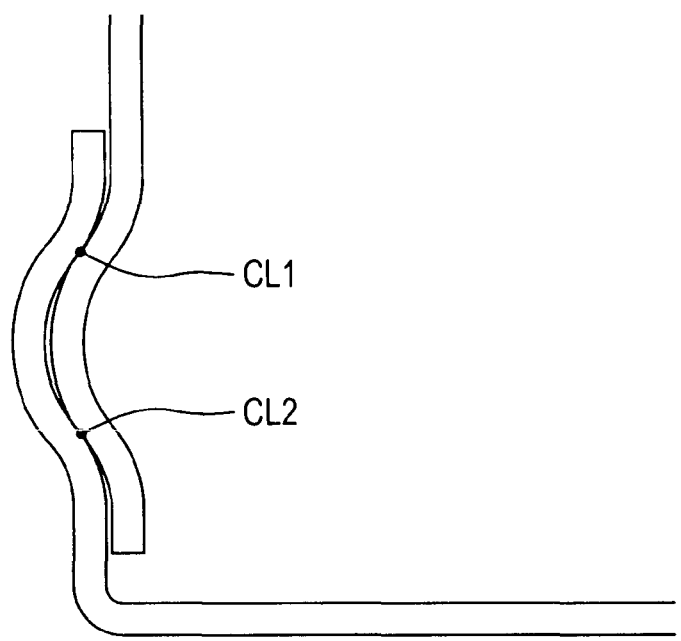
FIG. 8C is a closure detail of the trough or channel feature.
Figure 8D:
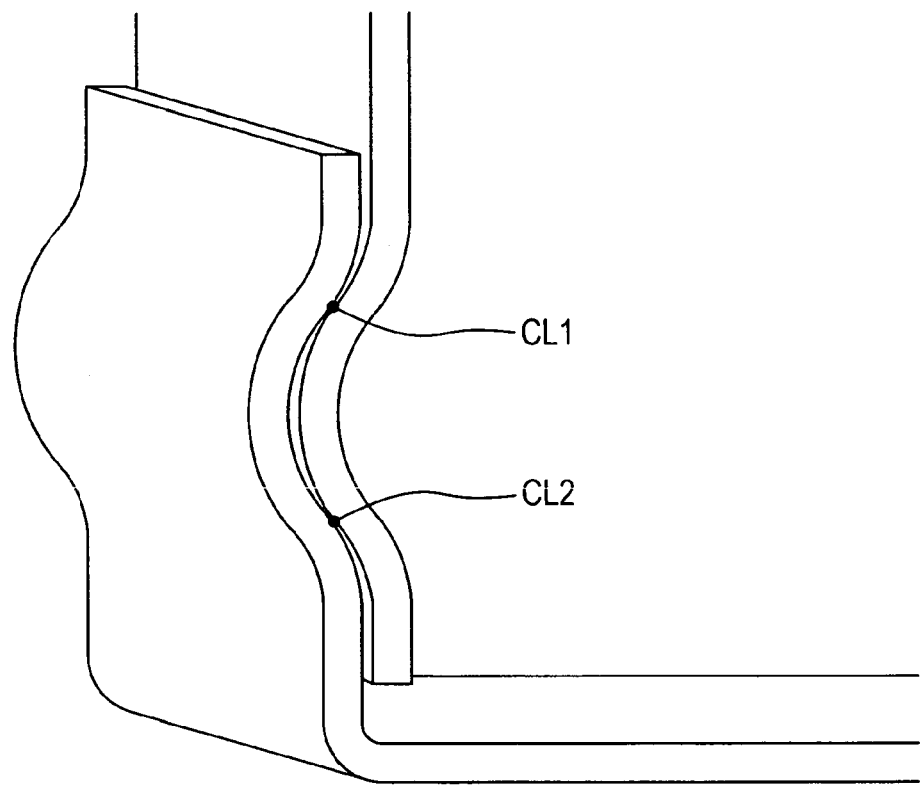
FIG. 8D illustrates the trough feature as viewed from ¾ side.

Referring again to FIG. 7B at the structure reference CC. Again, you see the semi-cylinder feature that's on the lid section, and at the structure referenced SD, you see the dimple that's in the base, again fitting the volumetric spherical space, "delta R sphere" space that the wave would have to negotiate. EMI entering this "space" would be reflected and absorbed, reflected and absorbed many, many times making it difficult to pass through that chamber. And the energy would be dissipated in heat and/or currents that are taken into the body of the chassis and fed off to fame (phonetic sp.) ground, and then ultimately office ground by whatever grounding system was implemented in this particular chassis.

FIGS. 8A-8D simply show the wave guide (channel, groove, etc.) features of having a semi-cylinder section formed in a base and a lid that allow, for example, in the lid at 1 at FIG. 7A, and in the base at reference 2. The illustrations are just a cut-away section of a sidewall and a lid interface where they overlap, and that's a wave guide that the wave would have to traverse through there. And it also can be used in a "sprung" assembly feature.

FIGS. 8C-8D once again illustrate the assembly feature of the sprung section with the cylinder-in-cylinder part of the alternate embodiment using the 2D/3D combination of features. At reference structures CL1 and CL2 (contact lines), a situation is created in which there would be incidental contact along a line that was parallel to the interface of the base and the lid and further augmenting the EMI shielding of the enclosure. The "line contacts" shown in reference structures CL1/CL2 make physical grounding, and such as overlap for an assembly feature, the overlap for the wave guide, and then incidental contact along the lines into the page at CL1/CL2 for providing further EMI shielding.

Figure 9:
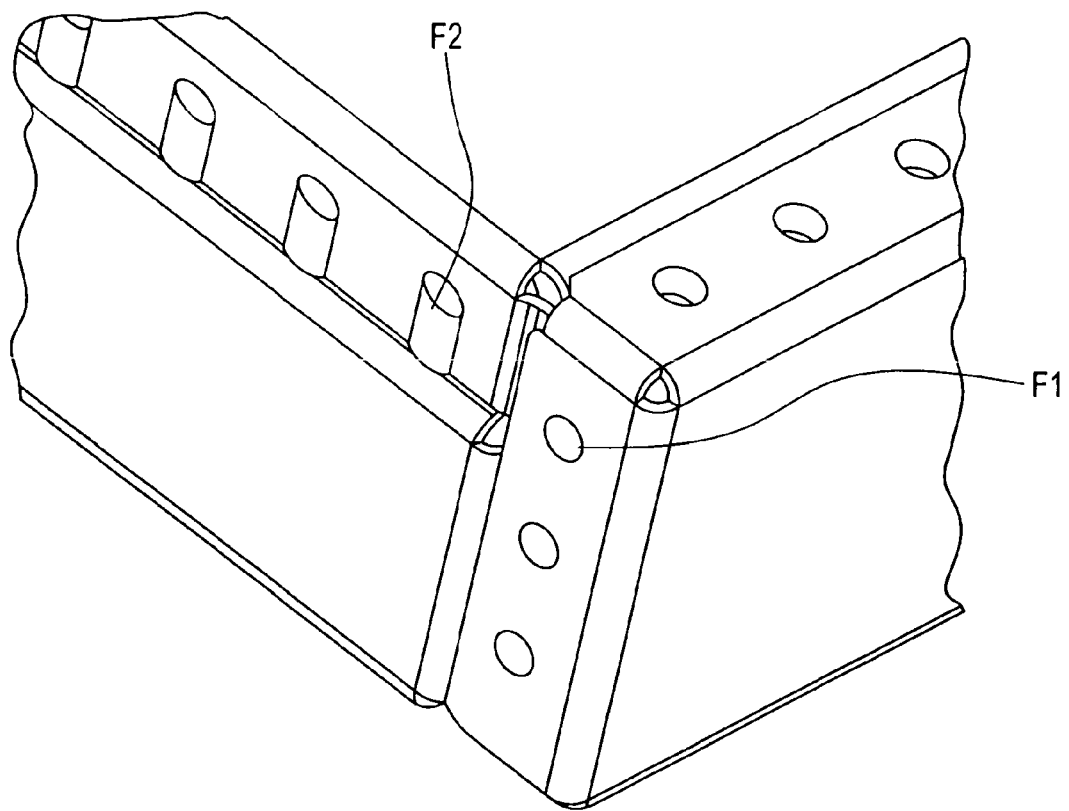
FIG. 9 illustrates an alternate embodiment of a "hybrid" computer enclosure using both 2D and 3D features.

Referring now to FIG. 9, a second alternate embodiment of the "cylinder and dome" hybrid enclosure is shown. FIG. 9 illustrates an enclosure that is a "three-piece construction" where there's a base with a stepped-in fringe to accept a lid (see above for descriptions of 4×1×1, 3×2×1 configuration for enclosures). And the base and the lid both have a step in to allow a five-sided nose to go over it. At structure reference F1, "dimples" on the perimeter of the face cone that slides over the base and lid. Those dimples on the under side that would be the mating semi-cylinders that, again, would force the EMI to traverse its' way between in order to escape the box. At structure reference F2, the semi-cylinders are seen on the outside (though in other embodiments, these structures could be inside without departing from the scope and spirit of the invention). The "dimples" as shown in structure reference 1' would be on the inside of the base underneath the peak of that semi-cylinder, the dome topped section of it.

Figure 10A:
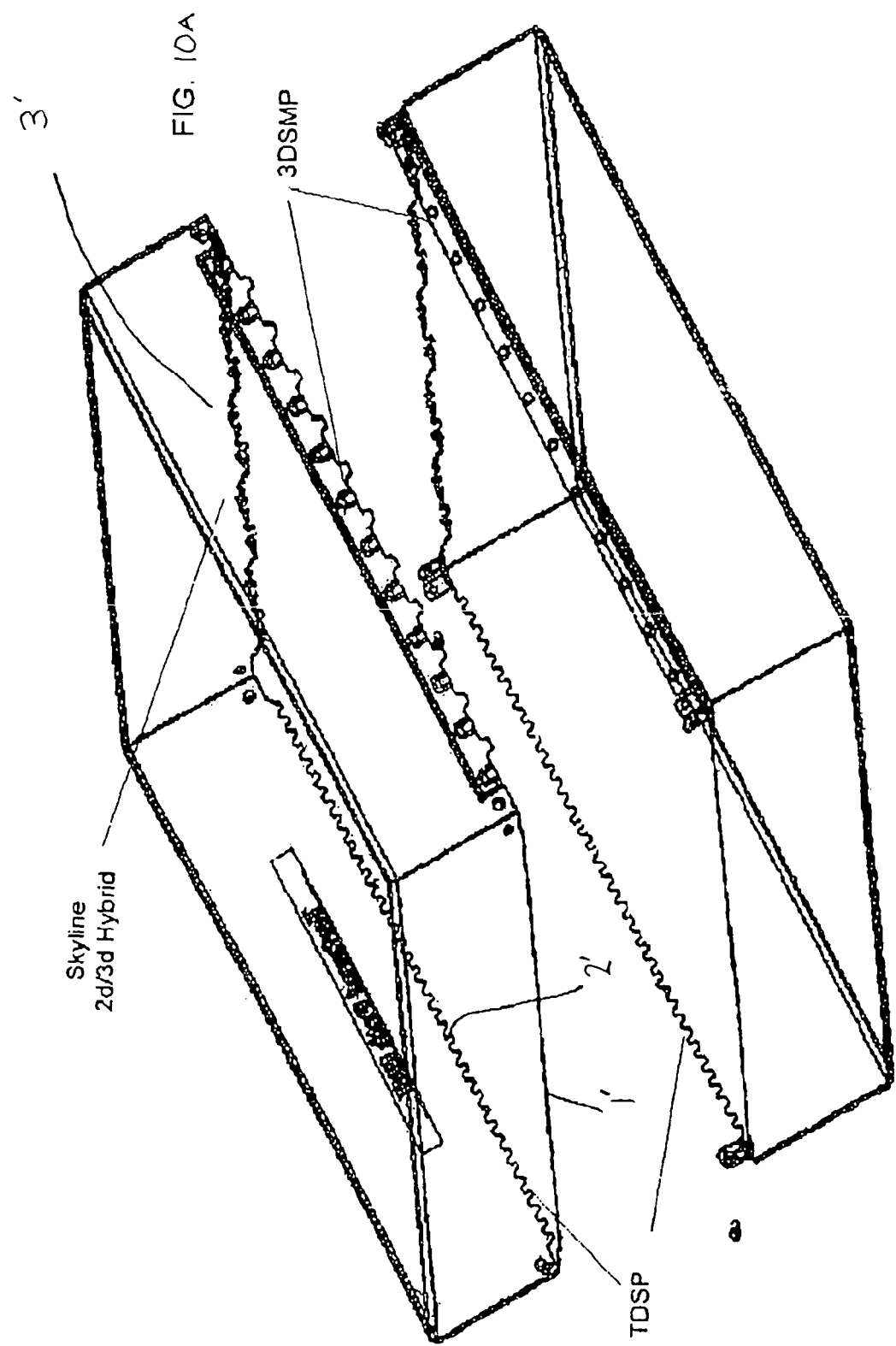
FIG. 10A is a second alternate and preferred embodiment of a "hybrid" computer enclosure ("skyline") using both 2D and 3D features.
Figure 10B:
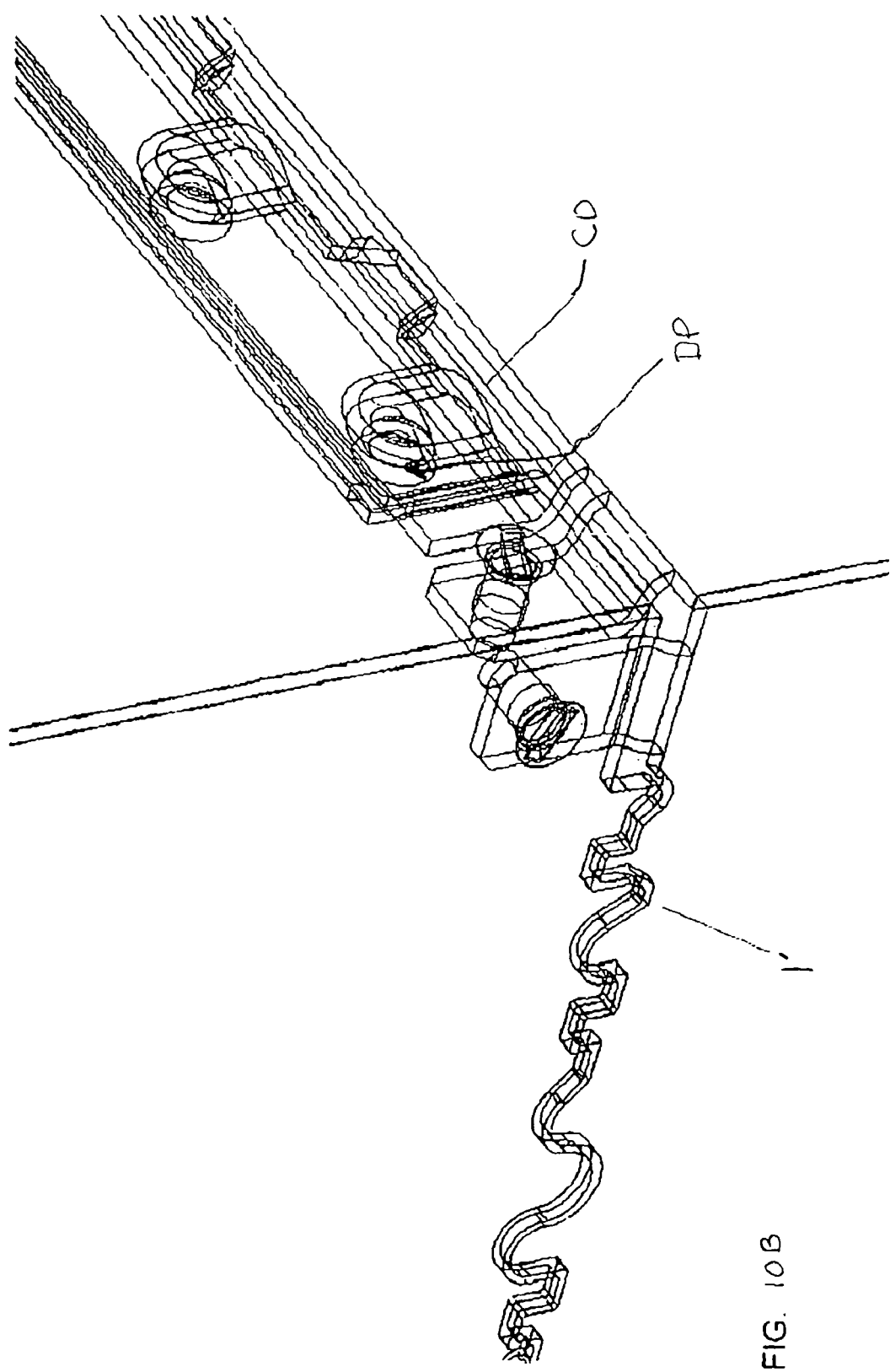
FIG. 10B is a close up of the second alternate embodiment at a corner.
Figure 10C:
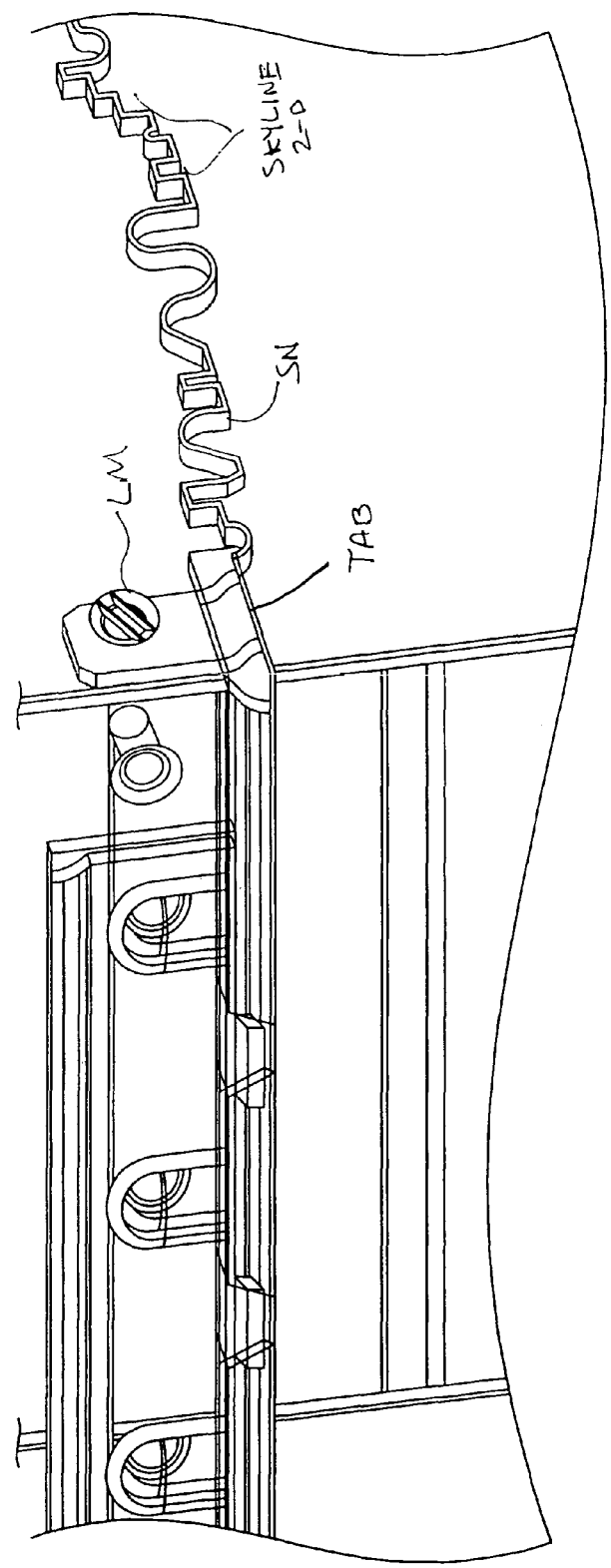
FIG. 10C is a perspective view of the details of the second alternate embodiment.
Figure 10D:
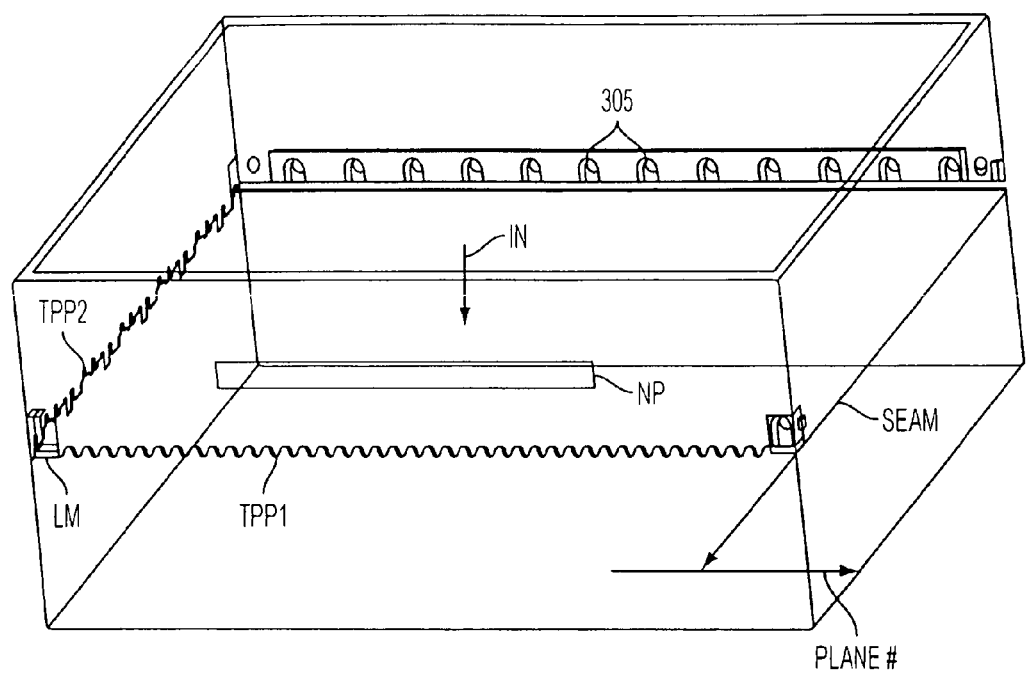
FIG. 10D is a macro view of the second alternate embodiment.

FIGS. 10A-C illustrate a third alternate embodiment of the EMI shielding enclosure, in which both two-dimensional and three-dimensional shapes are used to provide EMI shielding features ("skyline"). In FIG. 10A, a four-sided two-dimensional "tortured path" EMI-shielding features TDSP (see discussion regarding FIGS. 2A-C above regarding the generic discussion of the EMI-shielding tortured path two-dimensional solution) is shown on three sides and a three-dimensional sheet metal solution for "tortured path" 3DSMP on the fourth side (see discussion at FIG. 6 for purely three-dimensional solutions). The first side indicated at structure reference 1' is a simple straight slot which would have no tortured path features whatsoever, and would allow EMI to escape through that gap directly without any attempt to shorten the effective length. At structure reference 2' on the back face, there is a sinusoidally-cut "tortured path" edge where the base and lid would have sine waves that would fit into each other on the base and the lid and reduce the effective length to the longest section of a sine wave that can be the longest straight effective length gap along any portion of the sine wave as opposed to the entire side length in reference number 1'. On side edge structure reference 3', a "tortured path" EMI-shielding feature, again, which has a very irregular pattern ('skyline'), again, mating where they mate into each other, but a regular pattern to disallow any super position or disallow the wave to ability to set up over a series of sections that are similar or superimposed across the length of the cut, as in perhaps a square wave or a saw tooth. By changing the period and amplitude, super-positioning across the cuts is disallowed or at least greatly reduced.

Referring to FIG. 10B, a detailed view of the "skyline" second alternate embodiment shown in FIG. 10A, at reference structure 3' shows the dissimilar pattern or the non-symmetric pattern, which again shows a super position of a wave attempting to find intermittent sections of the wave that are in the same line and seeing those as one effective length of slot. At reference number DP, you see the dimple portion on the base, and again, the cylindrical dome section that sits over the dimple is at CD.

FIG. 10C is the solid model of the same illustration of the third or preferred alternate embodiment of the "hybrid enclosure" and you can just see at 1 and 2 two fringes that fold out and accept screws and/or rivets at 3 and 4. They could either be screws or rivets, and per cost most likely rivets, unless the box needs to be assembled and disassembled for maintenance or otherwise. Screws could then be used for final assembly (and easy disassembly).

Figure 11A:
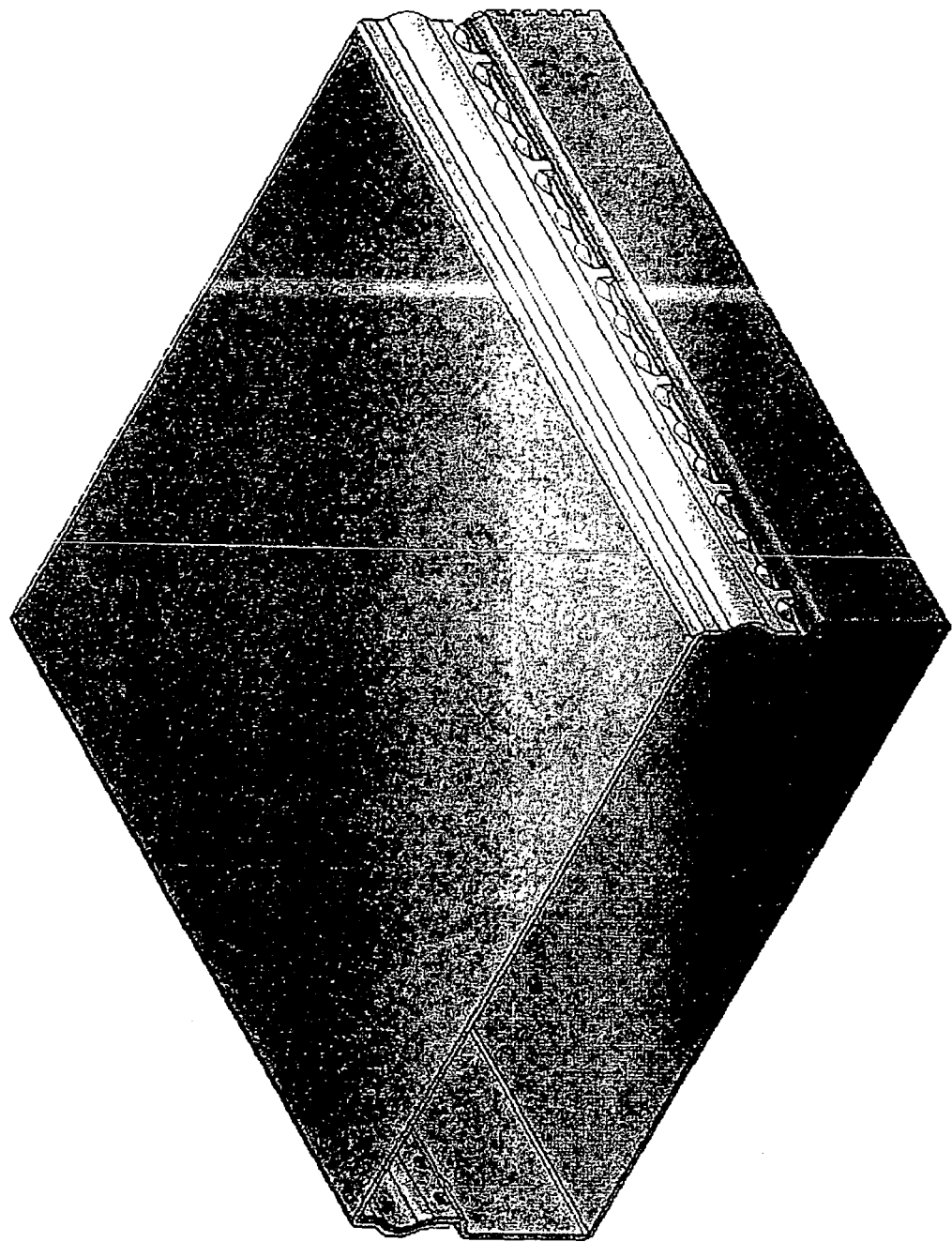
FIG. 11A illustrates a third alternate embodiment of a "hybrid" computer enclosure using both 2d and 3d shapes ("four box")
Figure 11C:
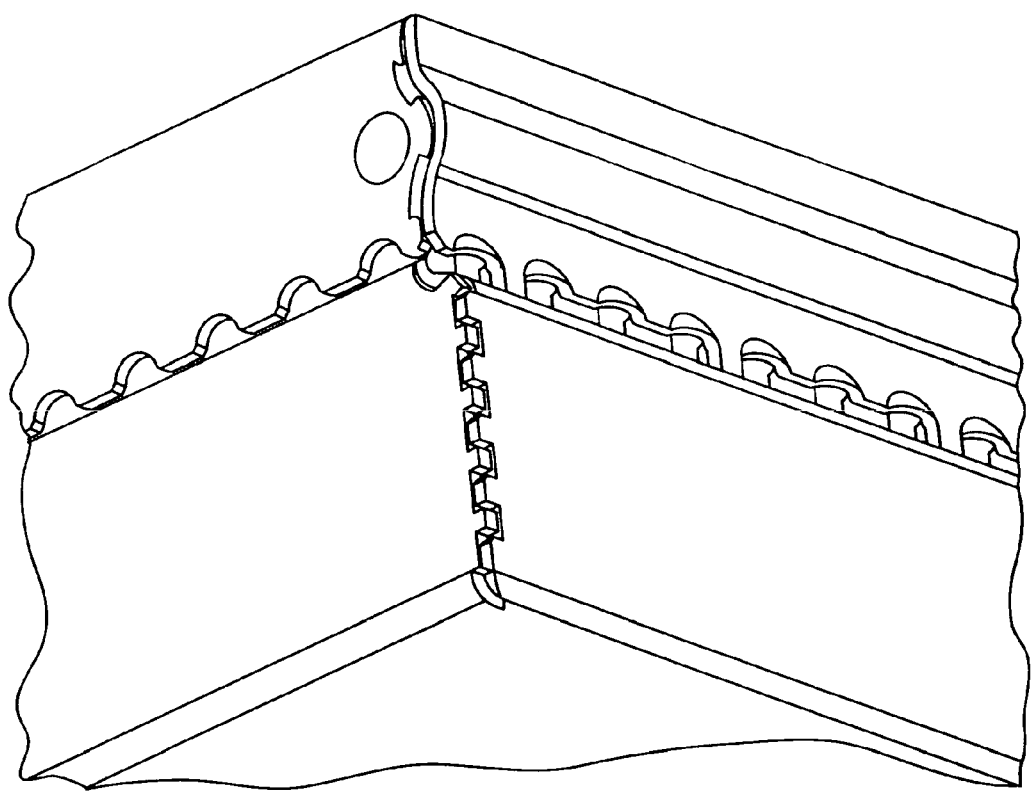
FIG. 11C illustrates additional features (solid view) of the third alternate embodiment.

FIGS. 11A-C illustrate a third alternate embodiment of the "hybrid" computer enclosure using a combination of two-dimensional and three-dimensional shapes ("four box"). Referring to FIG. 11A, discussing structure reference F, what that shows is the front section of the box, and it's left purposely undefined because it could be a variety of different IO configurations for any given box. The back and the two sides are shown completely sealed, assuming that all the IO on the A front axis box, for example, would be all in the front, and that could be a variety of different things, whatever types of connectors, or modules, or whether they de-sub SE-11, RG-11, RJ-45, whatever type of (standardized) interfaces that are required to be implemented to the particular "box" needed by the end user.

Referring now to FIG. 11B and Looking at location of the top left, reference X-1, that indicates the head of a rivet, and you can see in this (ghost)view that the through-hole goes dominance to the right of the rivet location on the corner of the box. [00121.] Reference structure SE-2 shows a notched section in the folded over lid where it's stepped. And then the side fringe that comes over projects into that gap to break up the effective length around the top corner edge of the box where you see it coming down and sweeping in an arc to the right and down again. Those notches at SE-2 and down about an inch below that are just to break up the effective length of that corner. SE-2 shows the sheet metal formed as step inward so that the lid can fold over the top of the base. In general, there would be some allowable clearance there in order to make sure that there was not tolerance issue on assembly or no interference on assembly. Reference SE-1 shows the alternate, the male equivalent of the female on the front portion of the lid, again breaking up the effective length of the lid interface at that seam.

Reference X-2 of FIG. 11B, the semi-circular cuts, are there to in order to break up the effective length (see discussion above) of the edge of the top fringe folded down over the back face, the bottom back face. The top face folds over into those semi-circular cuts. In order to that there isn't a "long straight antenna" created along that seam. If those semi-circular cuts are not there, there would be one long straight piece of sheet metal that could set up an antenna and radiate from surface currents an EMI off that surface. So they are to break up the effective length of the antenna. (See FIGS. 1A-E for illustrations of the "long straight antenna principle.) SE-2 shows the sheet metal formed as step inward so that the lid can fold over the top of the base. In particular configurations, there would be some allowable clearance there in order to make sure that there was not tolerance issue on assembly or no interference on assembly.

At structure reference 7, (similar to reference SE-2) in FIG. 11B, there is as similar tongue-in-groove type notching along the corner. Again, that breaks up the effective length of that seam, making it more difficult for various electromagnetic wavelengths (and forms) to escape out of that seam and for making for shorter, straight runs for creating less opportunity to set up an antenna on the edge of that seam. FIG. 5 is the female for the male on the back face, and reference structure 5 shows the female on the side face, as does reference 7 shows the female on the front face, with the male being on the side face. At structure reference 4, you see a projected section off the lid, which will penetrate down into a slot in the base, again breaking up effective links along that interface.

At structure reference 1, you see a semi-circular dome on the lid which sits over a dimple on the base, creating a tortured volume that EMI will have to propagate through; it would have to negotiate between the dimple and the dome. The structure referenced "SE-3" shows the step in on the side wall that steps in underneath and allows the lid to sit over the base.

The back section only shows the semi-circular cuts to break up the effective length of the antenna on the back. All three sides, however, have a rounded section that overlaps around, like cylindrical sections on the base and the lid that overlap each other, creating a wave guide. And on the sides you have the dome on dimple and the tongue-in-groove from the lid into the base that all break up effective length and force the EMI waves, electromagnetic waves, to negotiate all these different tortured path features. And on the back section, you see three rivet locations, and you also see the semi-circular cuts along the same, which will shorten the length of the antenna that could be along that seam and make it more difficult to radiate EMI waves off the back from surface currents.

FIG. 11C is the solid model of FIG. 11A. Once again, indicated at 1, you see the semi-cylindrical section that's rounded out from the lid. That would be considered the female to a male on the base that follows along that same profile creating a wave guard. As the wave attempts to escape the box, it comes through the interface where the base rises to meet the under surface of the lid. The wave has to come down and negotiate between those two cylindrical sections, and then it meets with the dome and dimples and the tongue-in-groove into the base. And the dome being indicated at 2, the dimple being indicated at 3, the tongue-in-groove, an example of that indicated at reference structure 4 where the tongue is in the lid, the groove is in the base. And then at reference structures 5 and 6, again you see along the seam between the back face and the side face, the square wave pattern of tongue-in-groove again to break up the effective length of that seam. And then at structure reference 7, you see the semi-circular cuts that break up the effective length of the long slot antenna, long edge antenna. Those semi-circular sections don't allow it to set up along that long section, and at reference structure 8, again that is a rivet-like structure (or just plain rivet) that goes through the lid and into the base, and would attach the box in that location.

Figure 12A:
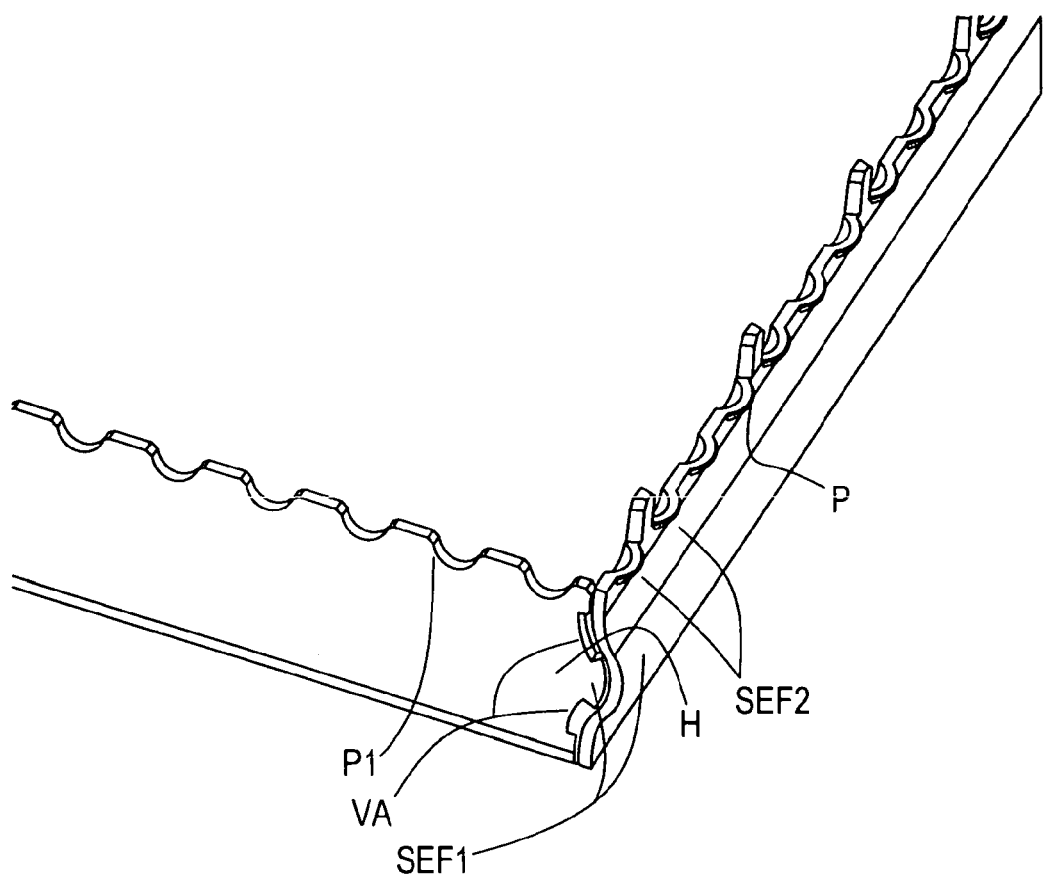
FIG. 12A illustrates a first component of the third alternate embodiment.

FIG. 12A shows a first part of the "four box" embodiment illustrated and discussed in FIGS. 11A-C, in FIG. 12A at structure reference P the projection of the lid, the tongue that would project into a slot groove in the base. Structure reference H is a hole for the rivet. At structure reference SE-F2 the semi-cylindrical section on the lid that would sit over and would provide a wave guide effect through the same profile on the base. This feature would also be used as a retention feature for mating the base to the lip. Still referring to FIG. 12A, at reference P1, the short section that's left by creating the semi-circular cuts in the lid do not allow for that long surface or edge antenna is illustrated. Reference P1 just reflects the effective length that's left after you cut out all these semi-circular holes. At Structure reference VA, the semi-circular cut is shown.

Figure 12B:
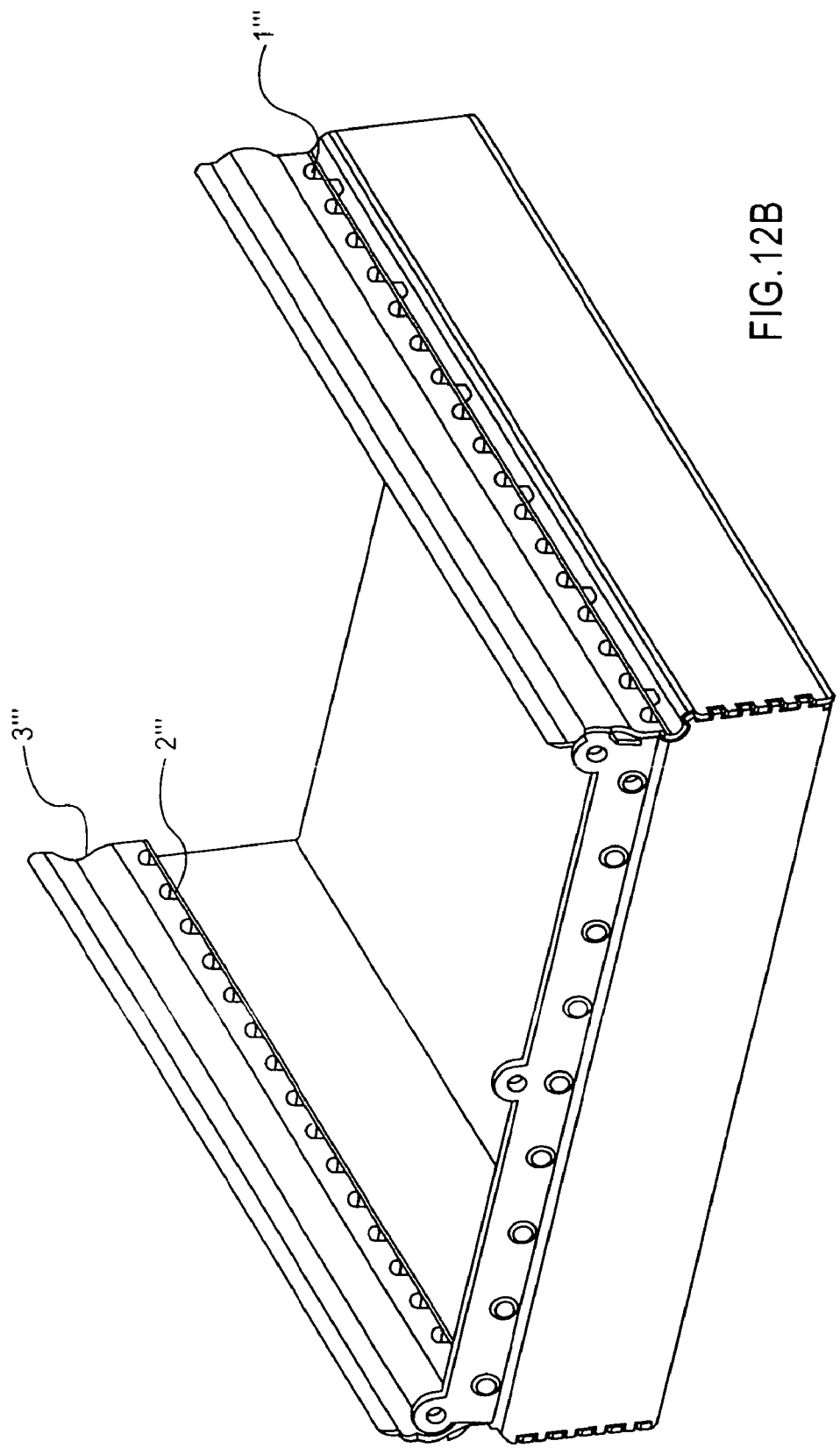
FIG. 12B illustrates a second component of the third alternate embodiment.

Now referring to FIG. 12B, a second portion of the "four box" of the third alternate embodiment of the electronics enclosure is shown. At structure reference 1''', the tongue-in-groove at the interface of that base edge, the bottom base edge is shown, the form dimples at structure reference 2'''. The cylindrical section is formed such that is the wave that when the lid snaps down over has the mating shape and enforces the wave guard for the wave to go through on both side walls.

However, there is a clear advantage the various embodiments shown above in FIGS. 3A-11C. For example, once the tool is paid for, providing EMI shielding using two and three dimensional shapes, no further costs are necessary. First, stamp it, form it and fold it, all on progressive dies. The manufacturing process is all automated, hands-off process. There are no press breaks or anything similar to break up the manufacturing flow. All hard tools are used and this stuff is done in a highly-efficient manner. There are a couple extra folds but that's to be traded off against welding, pre-plate post-plate materials, gaskets, screws and assembly. However, the tongue and groove is in a cut. It all depends on where the best results are obtained and variations depend on the needs the end-user and manufacturer.

I claim:

1. A enclosure for an electronic device including:
   a first piece made of conducting material, said first piece including a first partially cylindrical formation running along at least the length of one side, said cylindrical formation with a first radius;
   second piece made of conducting material, said second piece including a second partially cylindrical formation, said cylindrical formation with a second radius which is not the same as said first radius wherein said first partially-cylindrical formation slides over said second partially-cylindrical formation near a seam formed by said first and second pieces, such that said first piece contacts said second piece at two points along the line of said partially cylindrical formations along one side and a space in between said two points.

2. The enclosure as recited in claim 1, wherein said partially-cylindrical formations on said first and second pieces both curve outward.

3. The enclosure as recited in claim 1, further including set of two-dimensional patterns cut into at least two of the edges of said first piece.

4. The enclosure as recited in claim 3, further including a set of complementary multi-planar shapes formed into said first and second pieces along at least one seam.

5. The enclosure as recited in claim 4, wherein said partially-cylindrical channels run along at least two sides.

6. The enclosure as recited in claim 1, wherein said first sheet and said second sheet contact each other along two lines.

* * * * *